US012306731B2

(12) United States Patent
Schaefer et al.

(10) Patent No.: US 12,306,731 B2
(45) Date of Patent: May 20, 2025

(54) EVALUATION OF MEMORY DEVICE HEALTH MONITORING LOGIC

(71) Applicant: Micron Technology, Inc., Boise, ID (US)

(72) Inventors: Scott E. Schaefer, Boise, ID (US); Aaron P. Boehm, Boise, ID (US); Todd Jackson Plum, Boise, ID (US); Mark D. Ingram, Boise, ID (US); Scott D. Van De Graaff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 18/156,594

(22) Filed: Jan. 19, 2023

(65) Prior Publication Data

US 2023/0315599 A1     Oct. 5, 2023

Related U.S. Application Data

(60) Provisional application No. 63/268,529, filed on Feb. 25, 2022.

(51) Int. Cl.
*G06F 11/00*     (2006.01)
*G06F 11/07*     (2006.01)
*G06F 11/27*     (2006.01)
*G06F 11/30*     (2006.01)

(52) U.S. Cl.
CPC .......... *G06F 11/27* (2013.01); *G06F 11/0772* (2013.01); *G06F 11/3037* (2013.01)

(58) Field of Classification Search
None
See application file for complete search history.

(56) References Cited

U.S. PATENT DOCUMENTS

| | | | |
|---|---|---|---|
| 9,160,644 B1* | 10/2015 | Soffer | H04L 43/50 |
| 10,387,672 B1* | 8/2019 | Harland | G06F 21/85 |
| 11,775,378 B2* | 10/2023 | Balb | G06F 11/0727 |
| | | | 714/710 |
| 2013/0159797 A1* | 6/2013 | Peng | G11C 16/349 |
| | | | 714/E11.001 |
| 2015/0106660 A1* | 4/2015 | Chumbalkar | G06F 11/3058 |
| | | | 711/104 |
| 2020/0401477 A1* | 12/2020 | Klein | G06F 11/1068 |

* cited by examiner

*Primary Examiner* — Mujtaba M Chaudry
(74) *Attorney, Agent, or Firm* — Holland & Hart LLP

(57) ABSTRACT

Methods, systems, and devices for evaluation of memory device health monitoring logic are described. A memory device may include health monitoring logic that is operable to be enabled in a configuration that corresponds to an output, such as an expected output, regardless of a degradation level of the memory device. Such a configuration may be enabled in a mode, such as a test mode, during which the memory device, or a host device coupled with the memory device, or some combination, may evaluate a difference between the output and an actual output of the health monitoring logic. The actual output being the same as the output may provide an indication that at least a portion of the health monitoring logic is functioning properly, and the actual output being different than the output may provide an indication that at least a portion of the health monitoring logic is not functioning properly.

20 Claims, 10 Drawing Sheets

EVALUATION OF MEMORY DEVICE HEALTH MONITORING LOGIC

CROSS REFERENCE

The present Application for Patent claims priority to U.S. Provisional Patent Application No. 63/268,529 by SCHAEFER et al., entitled "EVALUATION OF MEMORY DEVICE HEALTH MONITORING LOGIC," filed Feb. 25, 2022, which is assigned to the assignee hereof, and which is expressly incorporated by reference herein.

FIELD OF TECHNOLOGY

The following relates to one or more systems for memory, including evaluation of memory device health monitoring logic.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
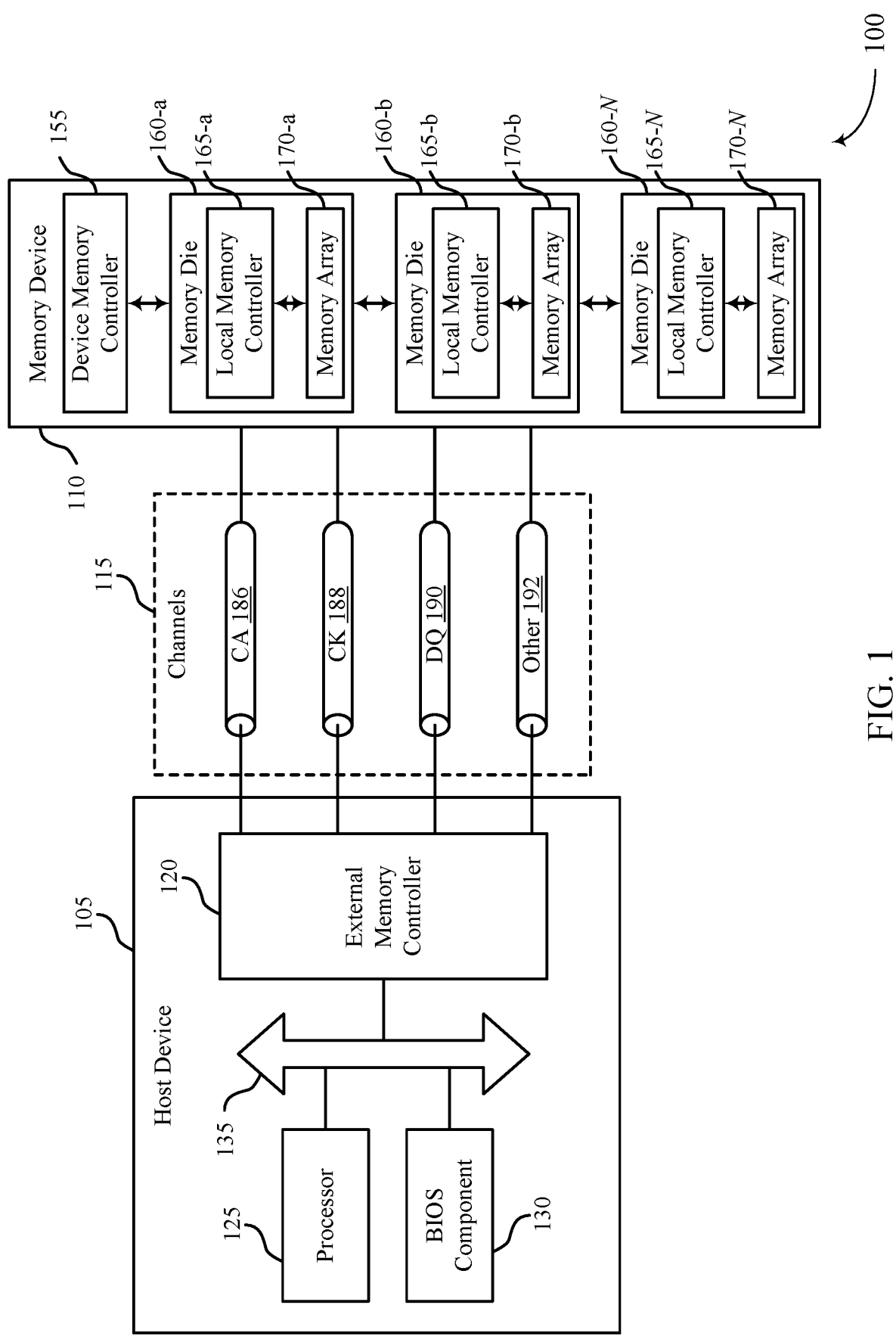
FIG. 1 illustrates an example of a system that supports evaluation of memory device health monitoring logic in accordance with examples as disclosed herein.

Memory devices may include components (e.g., circuitry, semiconductor die structures, transistors, memory cells) that change over time, over an accumulation of access operations, or over an accumulation of stress (e.g., electrical stress, thermal stress, mechanical stress), among other conditions, and these conditions may degrade performance of the memory device (e.g., degrade a capability for writing, maintaining, or reading information). Some memory devices may include logic, such as health monitoring logic (e.g., degradation monitoring logic, wear monitoring logic), that may be configured to monitor for degradation (e.g., wear or other parameters) and to notify another device (e.g., a host device) of a status of the memory device, or a status of one or more components thereof, such as a degradation status or an end-of-life status (e.g., a degradation fault, a degradation warning). In some examples, a memory device may be configured to perform degradation evaluations in accordance with multiple degradation levels, which may support an improved understanding of a rate of degradation, among other characteristics. However, in some examples, flagging of a degradation status, such as an indication that a memory device has reached or otherwise satisfied a threshold level of degradation, may occur relatively late in the life of a memory device. In some such examples, another device may lack an awareness of whether health monitoring logic of a memory device is functioning properly, such as when health monitoring logic is not properly detecting a wearout mode, which may result in the memory device failing without a warning or other early indication that would otherwise be provided by properly functioning health monitoring logic.

In accordance with examples as disclosed herein, a memory device may include health monitoring logic that is operable to be enabled in a configuration (e.g., a test mode configuration, a setting) that corresponds to an output, such as an expected output (e.g., a value, an output value, a forced output, a test mode output, an expected result, a configured result) regardless of (e.g., independent of) a degradation level of the memory device. Such a configuration may be enabled in a mode, such as a test mode (e.g., an evaluation mode, a diagnostic mode) during which the memory device, or a host device coupled with the memory device, or some combination of the devices, may evaluate a difference between the output, such as the expected output, (e.g., corresponding to the test mode configuration) and an actual output (e.g., a result, a generated value) of the health monitoring logic in the test mode. The actual output being the same as the output, such as the expected output, will provide an indication that at least a portion of the health monitoring logic is functioning properly, and the actual output being different than the expected output will provide an indication that at least a portion of the health monitoring logic is not functioning properly, which may be used to flag a fault (e.g., for replacement of the memory device, for operation of the memory device in a safe mode) or to reject the memory device, among other responsive operations. In accordance with these and other examples, techniques for the evaluation of memory device health monitoring may mitigate failure modes or operational uncertainties of a memory device that may be associated with faults of the health monitoring logic itself.

Features of the disclosure are initially described in the context of systems and dies as described with reference to FIGS. 1 and 2. Features of the disclosure are described in the context of degradation profiles, a memory device, and a process flow as described with reference to FIGS. 3-5. These and other features of the disclosure are further illustrated by and described with reference to an apparatus diagram and flowcharts that relate to evaluation of memory device health monitoring logic as described with reference to FIGS. 6-10.

FIG. 1 illustrates an example of a system 100 that supports evaluation of memory device health monitoring logic in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-$a$, memory die 160-$b$, memory die 160-N) may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory device 110 may include components (e.g., circuitry, semiconductor die structures, transistors, memory cells) that change over time, over an accumulation of access operations, or over an accumulation of stress (e.g., electrical stress, thermal stress, mechanical stress), among other conditions, which may degrade performance of the memory device 110 (e.g., degrade a capability for writing, maintaining, or reading information). In some examples, a memory device 110 (e.g., a device memory controller 155, a local memory controller 165) may include logic, such as health monitoring logic (e.g., degradation monitoring logic, wear monitoring logic), that may be configured to monitor for degradation and notify another device (e.g., a host device 105, over a channel 115) of a status of the memory device 110, or some component thereof, such as a degradation status or an end-of-life status (e.g., a degradation fault, a degradation warning). However, in some examples, flagging of a degradation status, such as an indication that the memory device 110 has reached or otherwise satisfied a threshold level of degradation, may occur relatively late in the life of the memory device 110. In some such examples, another device may lack an awareness of whether health monitoring logic of the memory device 110 is functioning properly, such as when health monitoring logic is not properly detecting a wearout mode, which may result in the memory device 110 failing without a warning or other early indication that would otherwise be provided by properly functioning health monitoring logic.

In accordance with examples as disclosed herein, a memory device 110 (e.g., a device memory controller 155, a local memory controller 165) may include health monitoring logic that is operable to be enabled in a configuration (e.g., a test mode configuration, a setting) that corresponds to an output (e.g., a value, an output value, a forced output, a test mode output, an expected result, a configured result), such as an expected output, regardless of (e.g., independent of) a degradation level of the memory device 110. Such a configuration may be enabled in a mode, such as a test mode (e.g., an evaluation mode, a diagnostic mode), during which the memory device 110, or a host device 105 coupled with the memory device 110, or some combination of the devices, may evaluate a difference between the output, such as the expected output, (e.g., corresponding to the test mode configuration) and an actual output (e.g., a result, a generated value) of the health monitoring logic in the test mode. The actual output being the same as the expected output will provide an indication that at least a portion of the health monitoring logic is functioning properly, and the actual output being different than the expected output will provide an indication that at least a portion of the health monitoring logic is not functioning properly, which may be used to flag a fault (e.g., for replacement of the memory device 110, for operation of the memory device 110 in a safe mode) or to reject the memory device 110 (e.g., during a manufacturing verification, during an assembly verification, during a system verification), among other responsive operations. Thus, various techniques for the evaluation of health monitoring logic of a memory device 110 in accordance with examples as disclosed herein may mitigate failure modes or operational uncertainties of a system 100 that may be associated with faults of the health monitoring logic of the memory device 110, among other advantages.

Figure 2:
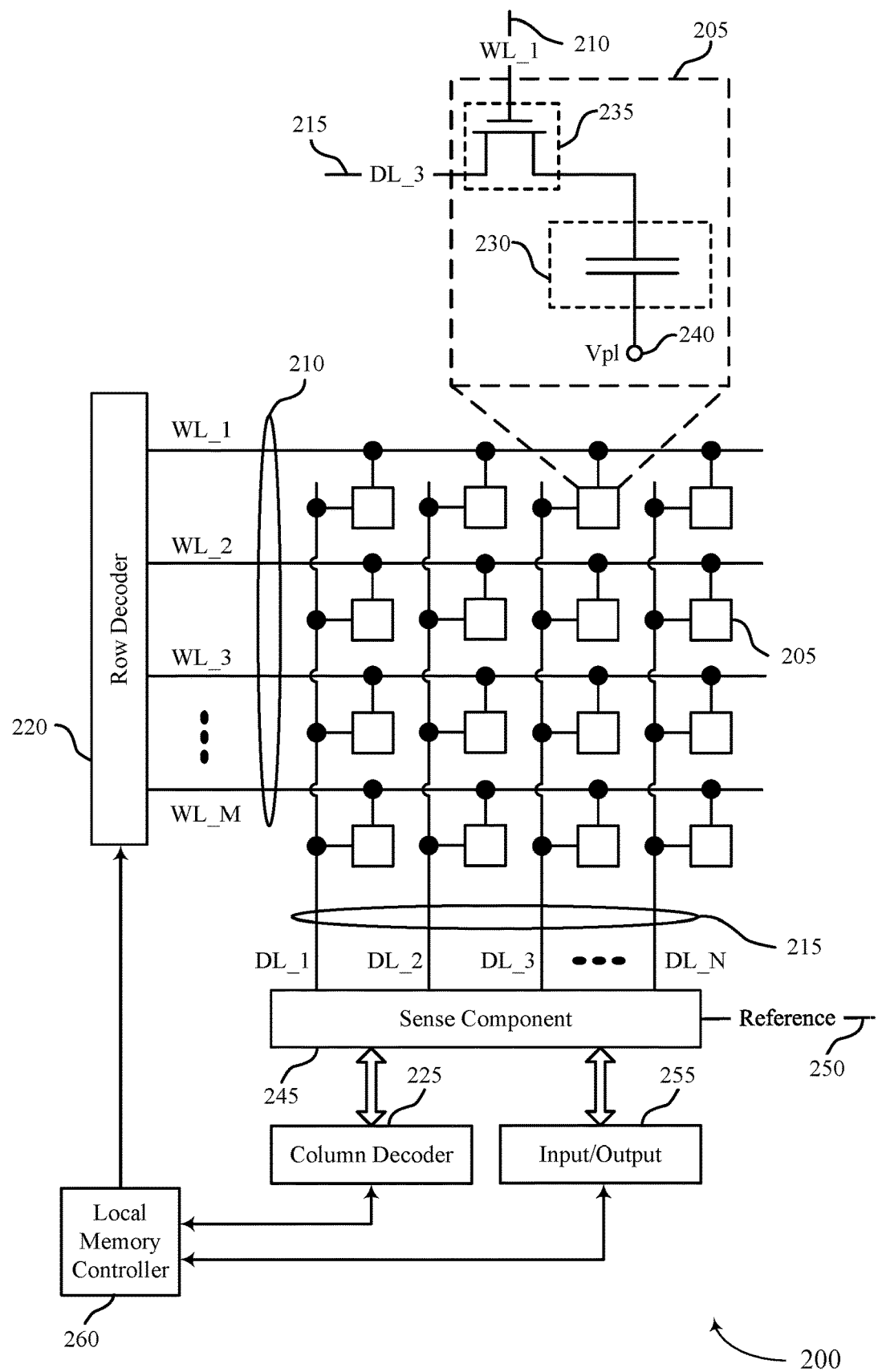
FIG. 2 illustrates an example of a memory die that supports evaluation of memory device health monitoring logic in accordance with examples as disclosed herein.

FIG. 2 illustrates an example of a memory die 200 that supports evaluation of memory device health monitoring logic in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210 and digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that couples the memory cell 205 with a sense component 245. In some architectures, the memory cell 205 may be selectively coupled with the digit line 215 during portions of an access operation. For example, the word line 210 and the switching component 235 of the memory cell 205 may be operable to couple or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

One or more components of a memory die 200 may change over time, over an accumulation of access operations, or over an accumulation of stress (e.g., electrical stress, thermal stress, mechanical stress), among other conditions, which may degrade performance of the one or more components of the memory die 200. In some examples, a memory die 200 (e.g., a local memory controller 260) may include logic, such as health monitoring logic, that may be configured to monitor for degradation of the memory die 200 and notify another device (e.g., a host device 105) or another component (e.g., a device memory controller 155) of a status of the memory die 200, or some component thereof, such as a degradation status or an end-of-life status. However, in some examples, flagging of a degradation status, such as an indication that the memory die 200 has reached or otherwise satisfied a threshold level of degradation, may occur relatively late in the life of the memory die 200. In some such examples, another device or component may lack an awareness of whether health monitoring logic of the memory die 200 is functioning properly, such as when health monitoring logic is not properly detecting a wearout mode, which may result in the memory die 200 failing without a warning or other early indication that would otherwise be provided by properly functioning health monitoring logic.

In accordance with examples as disclosed herein, a memory die 200 (e.g., a local memory controller 260) may include health monitoring logic that is operable to be enabled in a configuration (e.g., a test mode configuration, a setting) that corresponds to an output, such as an expected output (e.g., a value, an output value, a forced output, a test mode output, an expected result, a configured result) regardless of a degradation level of the memory die 200. Such a configuration may be enabled in a mode, such as a test mode (e.g., an evaluation mode, a diagnostic mode), during which the memory die 200, or a memory device 110 that includes the memory die 200, or a host device 105 coupled with a memory device 110 that includes the memory die 200, may evaluate a difference between the output (e.g., corresponding to the test mode configuration), such as the expected output, and an actual output (e.g., a result, a generated value) of the health monitoring logic in the test mode. The actual output being the same as the expected output will provide an indication that at least a portion of the health monitoring logic is functioning properly, and the actual output being different than the expected output will provide an indication that at least a portion of the health monitoring logic is not functioning properly, which may be used to flag a fault (e.g., for replacement of the memory die 200 or a memory device 110 that includes the memory die 200, for operation of the memory die 200 or memory device 110 that includes the memory die 200 in a safe mode) or to reject the memory die 200 or memory device 110 that includes the memory die 200 (e.g., during a manufacturing verification, during an assembly verification, during a system verification), among other responsive operations.

Figure 3:
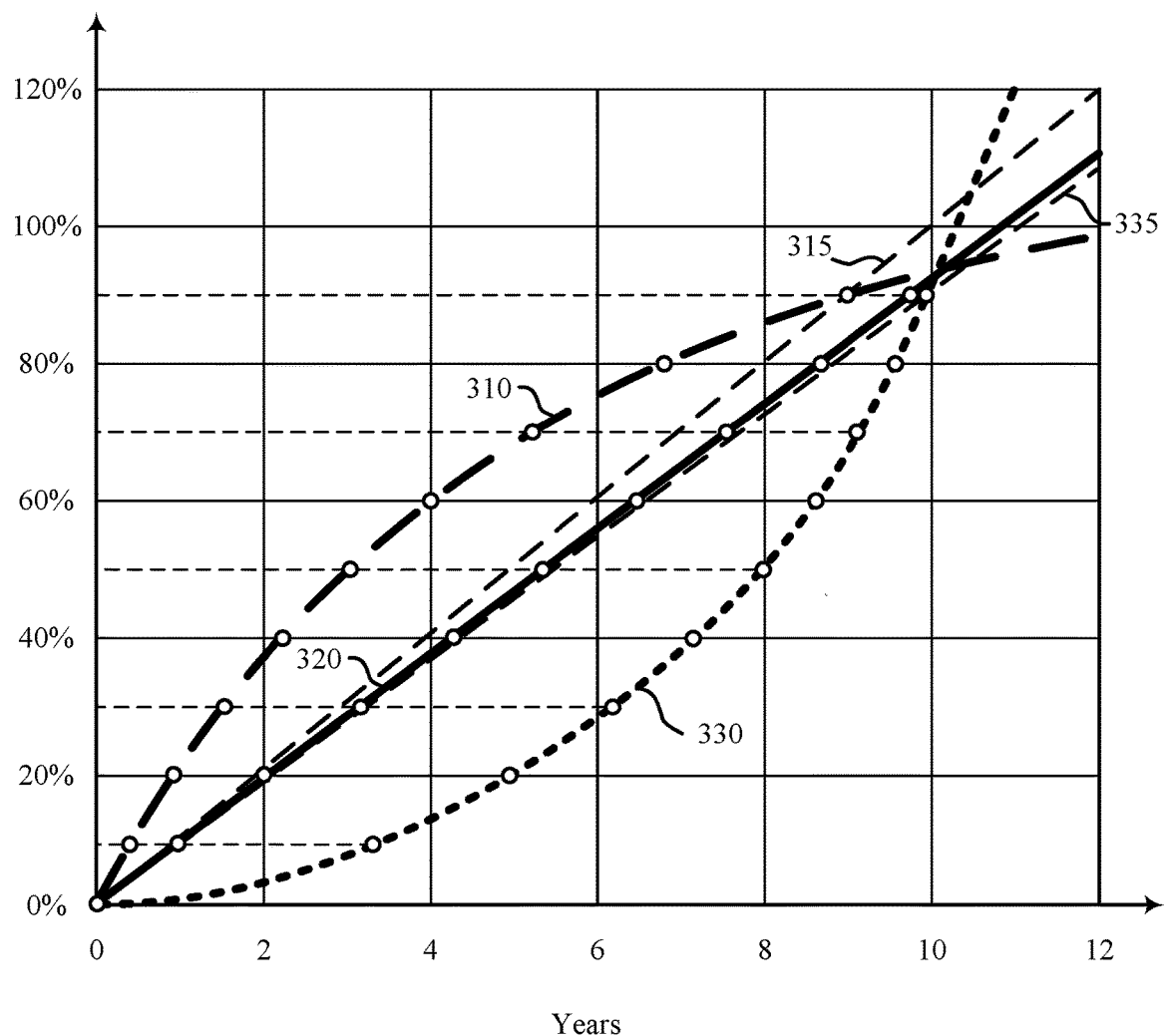
FIG. 3 illustrates an example of a degradation diagram that supports evaluation of memory device health monitoring logic in accordance with examples as disclosed herein.

FIG. 3 illustrates an example of a degradation diagram 300 that supports evaluation of memory device health monitoring logic in accordance with examples as disclosed herein. The degradation diagram 300 illustrates three example degradation profiles, including a first degradation profile 310 (a decelerating degradation profile), a second degradation profile 320 (e.g., a linear degradation profile), and a third degradation profile 330 (e.g., an accelerating degradation profile). Each degradation profile may be associated with a level of degradation (e.g., a level of wear) of a respective component of, for example, a memory device 110 over time, one or more of which may be monitored by the memory device 110, or a host device 105 that is coupled with the memory device 110.

Each degradation profile may be associated with a respective metric (e.g., a degradation metric, a degradation level), which may be normalized relative to a life expectancy (e.g., expressed as a percentage of life expectancy). In various examples, a degradation profile may be associated with a threshold voltage drift, a current drive drift, hot carrier stress degradation, negative bias temperature instability (NBTI) stress degradation, a dielectric degradation, a charge capacity (e.g., capacitance, polarization) degradation, a material state degradation, or other degradation. In some examples, a degradation profile may be associated with a respective transistor type (e.g., an N-type metal oxide semiconductor (NMOS) or a P-type metal oxide semiconductor (PMOS) transistor). In some examples, different metrics may be evaluated for different types of components, which may include different metrics being evaluated for different transistors, diodes, capacitors, resistors, oscillators, metal lines (e.g., measuring electromigration in the lines), different dielectric portions (e.g., measuring charge leakage), or other components of a memory device 110, or portions thereof.

In the example of degradation diagram 300, the first degradation profile 310 may be associated with degradation of a first metric, such as a threshold voltage degradation of a first transistor (e.g., a PMOS transistor) over time, which may be an example of a decelerating degradation phenomenon. The third degradation profile 330 may be associated with a degradation of a second metric, such as a threshold voltage degradation of a second transistor (e.g., an N-MOS transistor) over time, which may be an example of an accelerating degradation phenomenon. The second degradation profile 320 may be associated with a degradation of a third metric, or may represent a linear (e.g., normalized, averaged) degradation of one or more metrics (e.g., an average of the first metric and second metric). Although three degradation profiles are illustrated in the degradation diagram 300, a memory device 110 may monitor any quantity of one or more metrics (e.g., and associated degradation profiles) associated with a respective component, including the metrics listed herein, or other metrics not explicitly described herein.

In some cases, health monitoring logic of a memory device 110 may support notifying another device, such as a host device 105, when a metric satisfies a threshold or fails to satisfy a threshold, which may indicate that a threshold level of degradation (e.g., 90 percent of a life expectancy, or some other threshold level) of an associated component is satisfied. For example, for a component of the memory device 110 associated with the first degradation profile 310, the memory device 110 may determine that the component has reached a threshold of 90 percent of life expectancy (e.g., a 90 percent threshold level of degradation) at around the ninth year of operating the memory device 110. In some examples, a host device 105 may receive an indication of such a determination, and may determine or indicate device or operational information, such as a health status or warning information, based on the indication that the threshold level of degradation is satisfied.

In some cases, a memory device 110 or a host device 105 may not be aware of a degradation profile, or characteristic thereof (e.g., a degradation slope, a degradation acceleration, a degradation deceleration), associated with a monitored component of the memory device 110, and may rely on an assumption that degradation of the monitored component follows a default profile, such as a linear profile (e.g., as illustrated by the second degradation profile 320), or some other assumed degradation profile (e.g., a nominal degradation profile). For example, based on determining a 90 percent threshold level of degradation of the first metric at approximately nine years of operation, logic of a memory device 110 or a host device 105 may assume that the component associated with the first metric would reach 100 percent of the estimated life expectancy at approximately the tenth year of operating the memory device (e.g., based on a linear extrapolation 335), which may be overly conservative because the component may reach such a threshold at a time that is closer to the twelfth year of operating the memory device 110 (e.g., as illustrated by the first degradation profile 310). In another example, for a component of the memory device 110 associated with the third degradation profile 330, the memory device 110 may identify that the component has reached a threshold of 90 percent of life expectancy at nearly the tenth year of operating the memory device 110. However, logic of a memory device 110 or a host device 105 may assume that the component associated with the third metric would reach 100 percent of the estimated life expectancy at approximately the eleventh year of operating the memory device (e.g., based on a linear extrapolation 315), which may overestimate a remaining operable life because the component may reach such a threshold before the eleventh year of operating the memory device 110 (e.g., as illustrated by the third degradation profile 330).

In some examples, differences in degradation profiles between different components of a memory device 110 may result in varying accuracy for estimating remaining operable life of the memory device 110, or some portion thereof. Accordingly, health monitoring logic of a memory device 110 may be operable to evaluate different threshold levels of degradation, which may support the health monitoring logic evaluating whether a degradation phenomenon is decelerating (e.g., in accordance with the first degradation profile 310), linear (e.g., in accordance with the second degradation profile 320), or accelerating (e.g., in accordance with the third degradation profile 330), among other examples. For example, health monitoring logic may evaluate respective metrics for different components in accordance with ten percent life expectancy intervals (e.g., evaluating in accordance with a value of the metric at each ten percent of life expectancy), such that a host device 105 or a memory device 110 may perform a curve fit between evaluations over time of multiple degradation levels over time in order to perform an estimate of an end of an operable life of the memory device 110.

In some examples, configuration of the health monitoring logic at different threshold degradation levels may be controlled (e.g., commanded, requested) by a host device 105, which may include the host device 105 setting a threshold degradation level for evaluations by the health monitoring logic. A memory device 110 coupled with such a host device 105 may indicate when a threshold degradation level has been satisfied, which may be followed by the host device 105 setting a different threshold degradation (e.g., a subsequent wear level) for the health monitoring logic. For example, health monitoring logic may initially evaluate whether a threshold of ten percent of life expectancy has been satisfied and, based at least in part on determining and indicating that the threshold of ten percent of life expectancy has been satisfied, may be configured (e.g., controlled, commanded, requested) to evaluate whether a threshold of twenty percent of life expectancy has been satisfied, and so on. Such techniques may enable a system (e.g., a system 100) to predict end-of-life conditions for a memory device 110 more accurately than when assuming a degradation profile, which may improve reliability of the system.

In some examples, an indication that the memory device 110 has satisfied a threshold level of degradation may occur relatively late in the life of the memory device 110, and another device may lack an awareness of whether health monitoring logic of the memory device 110 is functioning properly. In accordance with examples as disclosed herein, health monitoring logic may support being enabled in a configuration that corresponds to an expected output regardless of (e.g., independent of) a degradation level of the memory device 110. For example, such health monitoring logic may support an evaluation at a threshold of zero percent of life expectancy, less than five percent of life expectancy, or some other master trip condition such as an initial life expectancy, which should indicate that evaluated threshold has been satisfied (e.g., during normal or successful operation). Such a configuration may be enabled in a mode, such as a test mode (e.g., an evaluation mode, a diagnostic mode) during which the memory device 110, or a host device 105 coupled with the memory device 110, or some combination of the devices, may evaluate a difference between the output (e.g., corresponding to the test mode configuration), such as the expected output, and an actual output (e.g., a result, a generated value) of the health monitoring logic in the test mode. The actual output being the same as the output, such as the actual output being the same as the expected output, may provide an indication that at least a portion of the health monitoring logic is functioning properly, and the actual output being different than the output, such as the actual output being different than the expected output, may provide an indication that at least a portion of the health monitoring logic is not functioning properly, which may be used to flag a condition, such as a fault condition (e.g., indicating a fault of the health monitoring logic).

Figure 4:
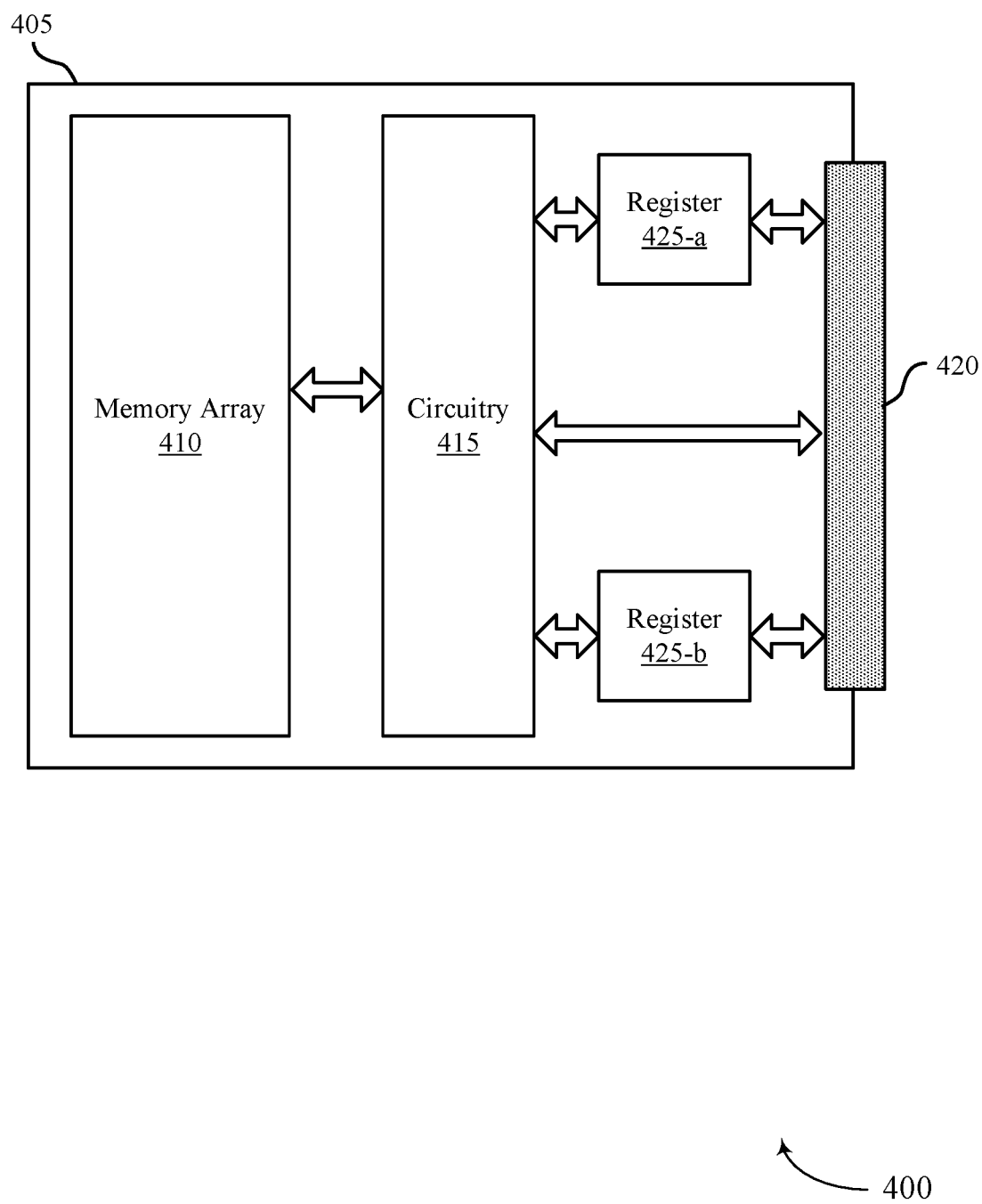
FIG. 4 illustrates an example of a memory device architecture that supports evaluation of memory device health monitoring logic in accordance with examples as disclosed herein.

FIG. 4 illustrates an example of a memory device architecture 400 that supports evaluation of memory device health monitoring logic in accordance with examples as disclosed herein. The memory device architecture 400 may include a memory device 405, which may be an example of aspects of a memory device 110 as described with reference to FIG. 1 or a memory die 200 as described with reference to FIG. 2.

The memory device 405 may include a memory array 410, which may be an example of aspects of a memory array 170 as described with reference to FIG. 1, or an array of memory cells 205 as described with reference to FIG. 2. The memory array 410 may include a collection (e.g., one or more grids, one or more banks, one or more tiles, one or more sections) of memory cells, with each memory cell being operable to store at least one bit of data.

The memory device 405 may also include circuitry 415 coupled with the memory array 410. In some examples, the circuitry 415 may include components for operating (e.g., accessing) the memory array 410. The circuitry 415 may be an example of aspects of a device memory controller 155 or a local memory controller 165 as described with reference to FIG. 1, or a local memory controller 260 as described with reference to FIG. 2. For example, the circuitry 415 may be operable to access one or more memory cells in response to a command received from a source external to the memory device 405, such as a host device 105 (not shown) coupled with the memory device 405. In some examples, the circuitry 415 may include components of a row decoder 220, a column decoder 225, a sense component 245, an input/output 255, among other components or combinations of components.

The memory device 405 may also include one or more pins 420 (e.g., communication pins, CA pins, DQ pins, contacts), which may be coupled with the circuitry 415. For example, the pins 420 may support the circuitry 415 exchanging data with a host device 105 or other source external to the memory device 405. The pins 420 may include an electrically conductive material (e.g., a conductive interface) that may be associated with channels 115 as described with reference to FIG. 1, including data channels 190 and CA channels 186, among other examples.

The memory device 405 may also include one or more registers 425 (e.g., a register 425-a, a register 425-b, a programmable register, a mode register, a configuration register, an adaptive flag register, a readout register), which may be written to or read from by the memory device 405, or a device external to the memory device 405 (e.g., by a host device 105), or a combination thereof. The registers 425 may be coupled with the pins 420, which may support the registers being accessed by (e.g., written to, read from) a host device 105. Additionally, or alternatively, the registers 425 may be coupled with the circuitry 415, which may support the registers being accessed by the circuitry 415 (e.g., by health monitoring logic of the circuitry 415). In some examples, the one or more registers 425 may serve as access points for monitoring a status or information associated with a health of the memory device 405 and may be enabled or disabled on a device basis.

The circuitry 415 may include health monitoring logic for monitoring a degradation level of one or more components of the memory array 410 or of other portions of the circuitry 415. For example, such health monitoring logic may include circuitry configured to monitor one or more metrics associated with a degradation profile (e.g., as described with reference to the degradation diagram 300) such as a wear level of a component (e.g., a resistor, a capacitor, a transistor, a diode, an oscillator, a driver, a latch, a register) of the memory device 405, a temperature of a component of the memory device 405, an operating frequency of a component of the memory device 405, among other metrics. In various examples, such monitoring may be performed on circuit components that support (e.g., directly support, are used during) the operation of the memory array 410 (e.g., circuit components that support access operations), or on components that do not support the operation of the memory array 410 (e.g., surrogate components, circuit components that mimic or approximate a degradation level of circuit components that support access operations), or any combination thereof.

In some examples, health monitoring logic of the circuitry 415 may monitor one or more degradation levels in accordance with a configuration (e.g., a reporting configuration, a monitoring configuration) received via a register 425 (e.g., the register 425-a) or in accordance with a default (e.g., predefined, as-built) configuration. For example, the memory device 405 may be configured with a set of one or more indexed degradation levels for the memory device 405, and a host device 105 may indicate a respective index to the memory device 405 via the register 425-a. Thus, a host device 105 may dynamically indicate a configuration of the health monitoring logic in accordance with a degradation level. For example, a first value of the register 425-a (e.g., '000') may correspond to a first index indicating a 100 percent degradation level, a second value of the register 425-a (e.g., '001') may correspond to a second index indicating a 90 percent degradation level, and so on.

The circuitry 415 may be configured to monitor (e.g., read a value from) the register 425-a. For example, after a host device 105 writes a value to the register 425-a (e.g., indicative of a corresponding index and degradation level), the circuitry 415 may read the value of the register 425-a and identify an index that corresponds to the value. The circuitry 415 may determine the corresponding degradation level of the set of indexed degradation levels in accordance with the index. Health monitoring logic of the circuitry 415 may be enabled to monitor one or more metrics of the memory array 410 in accordance with the indicated degradation level. Based on identifying the degradation level indicated via the register 425-a, the circuitry 415 may also be operable to read data or access health monitoring information stored in the memory array 410, to access health monitoring information written to a second register 425 (e.g., written to the register 425-b), or both. In some examples, the circuitry 415 may determine whether a metric of the memory device 405 satisfies the degradation level based on accessing the health monitoring information.

The circuitry 415 or the register 425-b may be operable to send an indication to a host device 105 if a metric of the memory device 405 satisfies the indicated degradation level. For example, the circuitry 415 may write a value to the register 425-b (e.g., a bit of a mode register) to indicate that the degradation level is satisfied, which may include setting a bit high (e.g., to a value of '1') to indicate that the degradation level is satisfied. A host device 105 may read the register 425-b, which may indicate to the host device 105 whether the indicated degradation level has been satisfied. For example, the host device 105 may poll (e.g., read from, monitor) the register 425-b periodically (e.g., at set time intervals), or in response to an indication from the memory device 405, among other initiating conditions. The host device 105 may read bit value(s) from the register 425-b, using a read command (e.g., a mode register read command). For example, the host device 105 may transmit the read command to the memory device 405, and the memory device 405 may read out the value from the register 425-b and send the value to the host device 105 in response to the read command.

In various examples, a device external to the memory device 405 may indicate one or more threshold degradation levels with an adaptable granularity, and health monitoring logic of the circuitry 415 may indicate when one or more metrics satisfy an indicated threshold degradation level. As such, a device external to the memory device 405 may obtain health monitoring information with sufficient granularity to identify degradation profiles for one or more components of the memory device 405, such as the degradation profiles illustrated in FIG. 3. In some examples, a host device 105 may utilize the identified degradation profiles to improve accuracy of predicted expiration timelines (e.g., a predicted end-of-life timeline) for the memory device 405 or one or more components thereof, which may improve reliability of the memory device 405, the host device 105, or both. Moreover, by setting dynamic threshold levels of wear and being flagged each time a metric satisfies a threshold, the host device 105 may refrain from continuously performing read operations, which may reduce power consumption.

To support evaluation of health monitoring logic itself, the health monitoring logic may be operable to be enabled in a configuration that corresponds to an expected output (e.g., an output value, a result) regardless of (e.g., independent of) a degradation level of the memory device 405. For example, the health monitoring logic may be configured with a trip point that provides an indication (e.g., a fault indication, and indication that a threshold degradation level has been satisfied) at a "time zero" or zero percent degradation, or some "initial" degradation that is below a threshold degradation, such as below 5 percent, below 10 percent, below 15 percent, etc. Such a configuration may support the memory device 405, or a host device 105 coupled with the memory device 405, or some combination of the devices evaluating a difference between the expected output (e.g., corresponding to the test mode configuration) and an actual output (e.g., a result, a generated value) of the health monitoring logic. The actual output being the same as the expected output may provide an indication that at least a portion of the health monitoring logic is functioning properly, and the actual output being different than the expected output may provide an indication that at least a portion of the health monitoring logic is not functioning properly.

In some examples, such a configuration may be enabled with an index of register 425-a corresponding to an as-built or zero percent degradation level. For example, a value of the register 425-a (e.g., '111') may correspond to an index indicating a zero percent degradation level where, at any point in the operation of the memory device (e.g., an initial power on, an initial power on while coupled with a host device 105, or other operating condition), a readout of the register 425-b should indicate that the corresponding degradation level has been satisfied (e.g., as a degradation fault). If an actual output of the health monitoring logic does not indicate that the corresponding degradation level has been satisfied, the memory device 405 or host device 105 coupled with the memory device 405 may determine a fault (e.g., of the memory device 405, of the health monitoring logic). In various examples, the value of the register 425-a for such a configuration may enable a portion (e.g., a monitoring circuit) of the health monitoring logic that corresponds to a zero percent degradation evaluation, or enable a setting or portion of the health monitoring logic that is otherwise configured to provide an indication regardless of a degradation state of the memory device 405.

In some other examples, such a configuration may be enabled with a master trip point for flagging a fault. For example, a value (e.g., a bit value, a fourth bit) of register 425-a may be associated with an indication of a forced fault, such as where a value of '0' may be associated with a 'no fault' condition and a value of '1' may be associated with a 'fault' condition. Such a value may have a master control over (e.g., supersede) other values of the register 425-a. For example, a value of '0' in a fourth bit position of the register 425-a may support the health monitoring logic evaluating the memory device 405 in accordance with a degradation level associated with the first through third bits (e.g., in accordance with an index '000' or '001' and so on) to determine whether to indicate a fault or other degradation indication (e.g., in the register 425-b), whereas a value of '0' in a fourth bit position of the register 425-a may be expected to be accompanied by a positively indicated fault or other degradation indication (e.g., an expected value of the register 425-b in a test mode).

In these and other examples, the health monitoring logic of the circuitry 415 may be evaluated for proper operation by comparing (e.g., in a test mode) an actual result of the health monitoring logic with an expected result, such as comparing an actual indication of the register 425-b with an expected indication of the register 425-b. When such a comparison identifies a disagreement between the actual and expected values, a flag may be set (e.g., by a host device 105 coupled with the memory device 405) to indicate a fault (e.g., for replacement of the memory device 405, for operation of the memory device 405 in a safe mode) or to reject the memory device 405 (e.g., during a manufacturing verification, during an assembly verification, during a system verification), among other responsive operations. Thus, various techniques for the evaluation of health monitoring logic of a memory device 405 in accordance with examples as disclosed herein may mitigate failure modes or operational uncertainties of a system that may be associated with faults of the health monitoring logic of the memory device 405.

Figure 5:
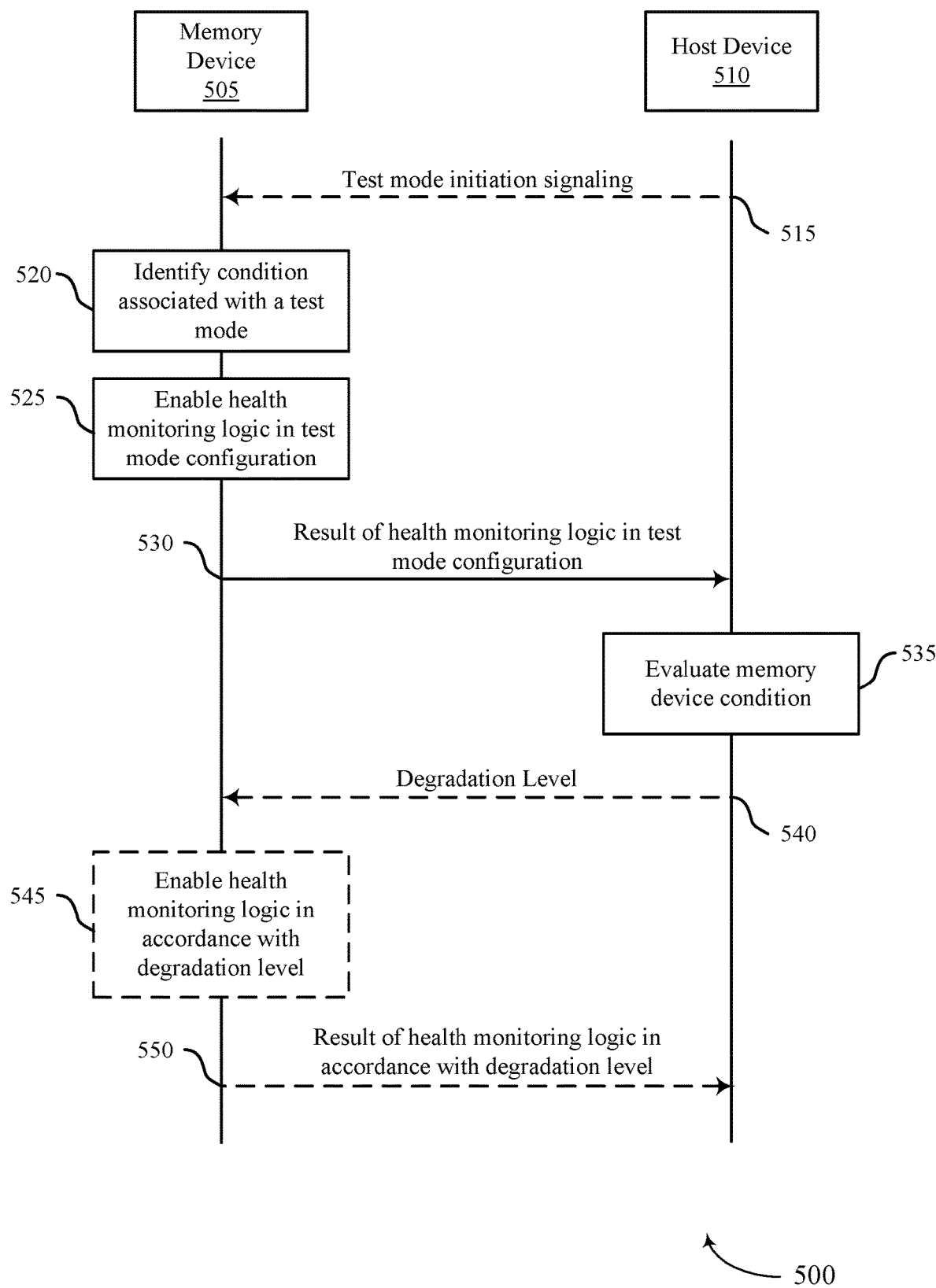
FIG. 5 illustrates an example of a process flow that supports evaluation of memory device health monitoring logic in accordance with examples as disclosed herein.

FIG. 5 illustrates an example of a process flow 500 that supports evaluation of memory device health monitoring logic in accordance with examples as disclosed herein. The process flow 500 may illustrate operations of a memory device 505 and a host device 510. In some examples, the host device 510 and the memory device 505 may represent aspects of a host device and a memory device as described with reference to FIGS. 1-4. For example, the host device 510 may be at least a portion of a vehicle, or a vehicle controller, and the memory device 505 may provide a storage medium for one or more functions of the vehicle or vehicle controller. The process flow 500 may illustrate a process for evaluating health monitoring logic (e.g., of circuitry 415) in a test mode, which may support an output of the health monitoring logic as generated in a test mode configuration being compared with an expected output of the health monitoring logic in the test mode configuration.

At 520, the memory device 505 may identify a condition associated with a test mode of the memory device 505 (e.g., a test mode that supports evaluating health monitoring logic of the memory device 505). In some examples, the test mode may be associated with an initial condition (e.g., an initial operation, an initial powering, a commissioning) of the memory device 505. For example, identifying the condition associated with the test mode at 520 may be based at least in part on the memory device 505 identifying an initial power on of the memory device 505 (e.g., a first time power is provided to the memory device 505, a first time power is provided to circuitry 415 of the memory device 505), or identifying an initial power on of the memory device 505 while coupled with the host device 510 (e.g., to avoid entering the test mode a first time power is applied while not connected with a host device, such as during a manufacturing evaluation operation or probe test). In some examples, identifying the condition associated with the test mode may be based at least in part on the memory device 505 identifying a duration of operating the memory device 505, such as identifying that a duration of operating the memory device 505 satisfies (e.g., exceeds) a threshold duration, which may be an initial duration of powering or operating the memory device 505 or some other later time (e.g., in accordance with a service or evaluation interval). In some examples, identifying the condition associated with the test mode at 520 may be based at least in part on a register (e.g., a register 425-a, a mode register) being set to an initial state (e.g., an as-manufactured state), which may prompt the memory device 505 to enter the test mode (e.g., during initial power up or boot operations).

In some examples, identifying the condition associated with the test mode may be responsive to signaling received from outside the memory device 505, such as signaling received from the host device 510. For example, at 515, the host device 510 may transmit test mode initiation signaling, which may be received by the memory device 505. In some examples, the host device 510 may transmit an indication of a configuration of the health monitoring logic that corresponds to an expected output, which the memory device 505 may use (e.g., at 520) to identify the condition associated with the test mode. In some examples, such an indication may be associated with the host device 510 transmitting a command to write a mode register (e.g., to write a register 425-a) of the memory device 505 (e.g., with a degradation level index or a master trip condition of the health monitoring logic for outputting a fault indication or other expected indication). In some examples, the host device 510 may transmit a command or request to enable the health monitoring logic in a configuration that corresponds to an expected output, which the memory device 505 may use (e.g., at 520) to identify the condition associated with the test mode.

At 525, the memory device 505 may enable health monitoring logic of the memory device 505 in a test mode configuration (e.g., based at least in part on the condition associated with the test mode as identified at 520). The test mode configuration may correspond to an output of the health monitoring logic (e.g., an expected output). In some examples, the test mode configuration may be associated with a master trip condition of the health monitoring logic for indicating a fault (e.g., to evaluate whether the health monitoring logic outputs a fault, as expected). In some examples, enabling the health monitoring logic in the test mode configuration may include enabling a first portion of the health monitoring logic (e.g., a portion associated with evaluating in accordance with a 0% degradation level) that is different than a second portion of the health monitoring logic that is associated with a degradation level of the memory device 505 (e.g., a portion associated with evaluating in accordance with a 10% degradation level). In some examples, enabling the health monitoring logic in the test mode configuration may include enabling a portion of the health monitoring logic that supports outputting an expected output regardless of a degradation level of the memory device 505.

At 530, based at least in part on the enabling of 525, the memory device 505 may output an indication of a result of the health monitoring logic (e.g., a result generated by the health monitoring logic in the test mode configuration), which may be received by the host device 510. In some examples, the indicated result of 530 may include outputting an indication of a value that is equal to the expected output based at least in part on a successful (e.g., nominal, normal) operation of the health monitoring logic of the memory device 505. In some examples, the indicated result of 530 may include outputting an indication of a value that is different than the expected output based at least in part on an unsuccessful (e.g., abnormal, failed) operation of the health monitoring logic, which may indicate a fault (e.g., a failure, an inoperability) of the memory device 505 or health monitoring logic thereof.

In some examples, the indicating of 530 may include writing (e.g., by the memory device 505) an indication of the result of the health monitoring logic to a register (e.g., a register 425-b, a mode register) and outputting the indication of the result of the health monitoring logic from the register. In some examples, to support the indication of 530, the host device 510 may transmit a command to read the register, which the memory device 505 may respond to by accessing the register and providing the stored indication. In some examples, the indication of 530 may include outputting an indication of whether a degradation level of the memory device 505 satisfies a threshold, where the expected output may be associated with an indication that the degradation level of the memory device 505 satisfies the threshold (e.g., where not indicating that the degradation level satisfies the threshold may be interpreted as an indication of a fault of the memory device 505 or health monitoring logic thereof).

At 535, the host device 510 may evaluate (e.g., infer, ascertain, determine) a condition of the memory device 505 based at least in part on the indicated result of 530. For example, at 535, the host device 510 may determine a fault of the memory device 505 based at least in part on the indicated result of 530 being different than the expected output associated with the test mode configuration. In some such examples, the host device 510 may respond by signaling an indication (e.g., to a user, to another portion of a system that includes the memory device 505 and host device 510) that the host device 510 has determined the fault of the memory device 505 (e.g., of the health monitoring logic). For various examples in which the host device 510 determines a fault at 535, the host device 510 may cease operations with the memory device 505, or may use the memory device 505 for lower-priority information or operations, or may use a different memory device 505 (not shown). For some examples in which the host device 510 determines a fault at 535, the host device 510 may provide an indication (e.g., to a user) that the memory device 505 should be retired or replaced.

In some other examples, at 535, the host device may determine an expected operation of the health monitoring logic based at least in part on the indicated result of the health monitoring logic being equal to the expected output. In such examples, the host device 510 may proceed with further operations of the memory device 505 (e.g., including the operations of 540, 545, and 550, among other operations).

In some examples, to support the evaluation of 535, the host device 510 may identify that the health monitoring of the memory device 505 is or was operating in the test mode configuration (e.g., corresponding to the expected output, to support the comparison between the result indicated at 530 with the expected output). In examples that include test mode initiation signaling at 515 (e.g., a command to initiate the test mode, an indication of a configuration of the health monitoring logic associated with the test mode), such an identification by the host device 510 may be based at least in part on an understanding that such signaling was transmitted by the host device 510. In some examples that do not include test mode initiation signaling of 515, the host device 510 may receive an indication from the memory device 505 that the result of 530 is associated with the test mode configuration. For example, the host device 510 may receive an indication associated with the test mode from the memory device 505, such as an indication of the configuration of the health monitoring logic that corresponds to the expected output. In some examples, such an indication of the health monitoring logic configuration may be written in a register (e.g., a register 425-*a*, a mode register) and, to support the host device 510 identifying that the indicated result of 530 is associated with the test mode, the host device 510 may transmit a command to read the register, which the memory device 505 may respond to by accessing the register and providing the stored indication.

Although, in some examples, the evaluation of 535 may be performed at the host device 510, in some other examples, such an evaluation may be performed at the memory device 505. For example, the memory device 505 may have an understanding of the expected output of the health monitoring logic in the test mode, and the memory device 505 may compare the expected output of the health monitoring logic with the output generated by the health monitoring logic in the test mode. In cases where the generated output is equal to the expected output, the memory device 505 may indicate to the host device 510 that the health monitoring logic is operating as expected (e.g., nominally, normally). In cases where the generated output is different than the expected output, the memory device 505 may indicate to the host device 510 that the health monitoring logic is not operating as expected (e.g., has failed, is operating abnormally).

In some examples, at 540 (e.g., based at least in part on determining that the health monitoring logic is operating as expected), the host device 510 may transmit an indication of a degradation level, which may be received by the memory device 505. The indicated degradation level of 540 may be associated with a threshold degradation level for evaluating the memory device 505 using the health monitoring logic.

In some examples, at 545, the memory device 505 may enable the health monitoring logic of the memory device (e.g., in an evaluation mode) in accordance with the degradation level indicated at 540. For example, the memory device 505 may evaluate whether a degradation metric associated with one or more components of the memory device 505 satisfies the indicated degradation level.

In some examples, at 550, the memory device 505 may output an indication of a result of the health monitoring logic in accordance with the degradation level. For example, the memory device 505 may output an indication that one or more components of the memory device satisfy the degradation level indicated at 540, of that one or more components of the memory device 505 do not satisfy the degradation level indicated at 540. In some examples, when the memory device 505 indicates that one or more components of the memory device 505 satisfy the degradation level indicated at 540, the operations of 540, 545, and 550 may be repeated for a new degradation level (e.g., a subsequent degradation level), which may support a curve-fitting of a degradation profile by the host device 510.

Thus, in accordance with examples disclosed herein, a memory device 505 and a host device 510 may support progressive evaluations of degradation levels of the memory device 505, which may support an improved insight of a given degradation profile (e.g., whether the memory device 505, or component thereof, is degrading in accordance with a decelerating degradation profile or an accelerating degradation profile). Moreover, by implementing an evaluation of the health monitoring logic itself, the memory device 505 and the host device 510 may support a greater reliability for providing such an understanding of an operable life of the memory device 505, which may further improve operational reliability.

Figure 6:
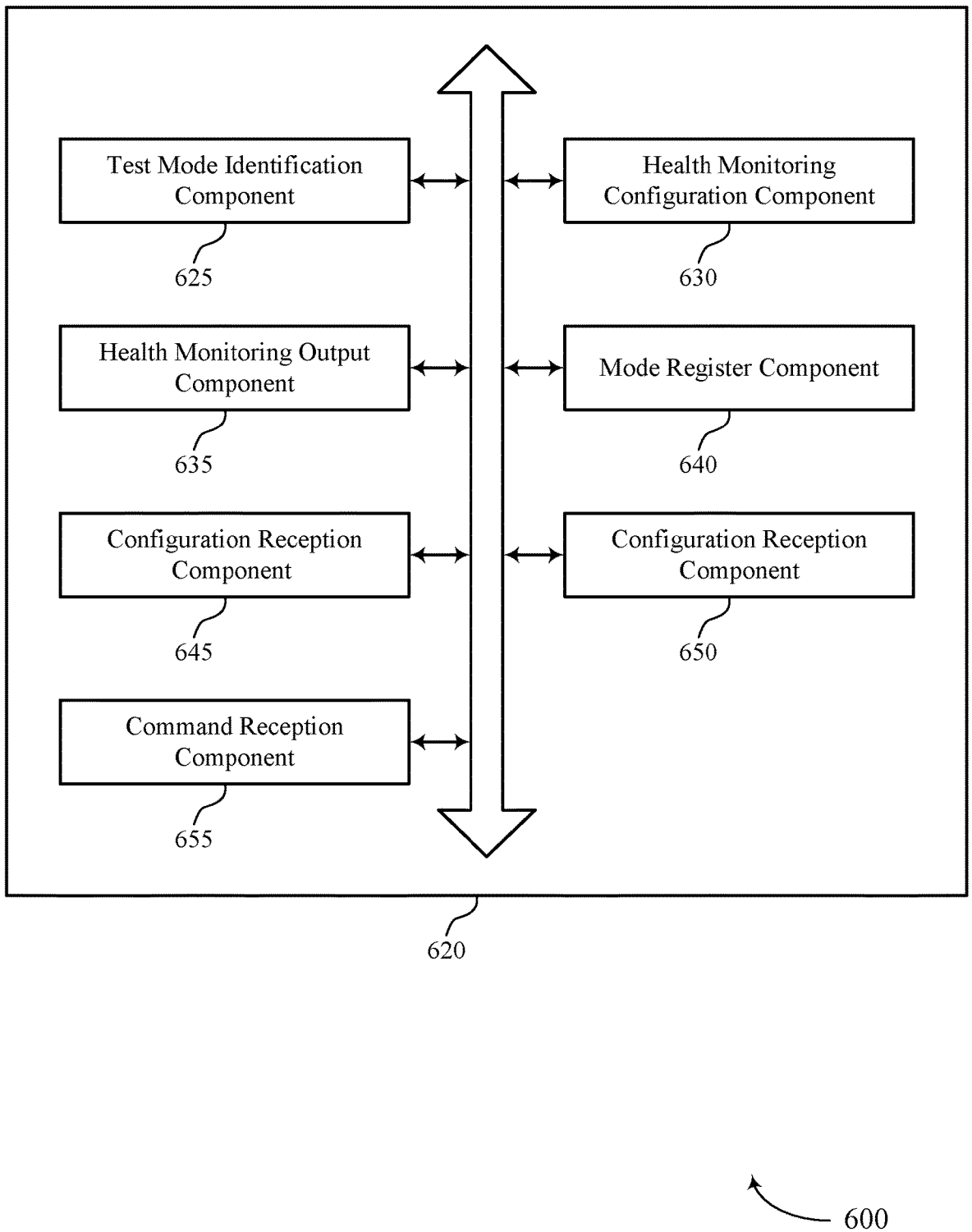
FIG. 6 shows a block diagram of a memory device that supports evaluation of memory device health monitoring logic in accordance with examples as disclosed herein.

FIG. 6 shows a block diagram 600 of a memory device 620 that supports evaluation of memory device health monitoring logic in accordance with examples as disclosed herein. The memory device 620 may be an example of aspects of a memory device as described with reference to FIGS. 1 through 5. The memory device 620, or various components thereof, may be an example of means for performing various aspects of evaluation of memory device health monitoring logic as described herein. For example, the memory device 620 may include a test mode identification component 625, a health monitoring configuration component 630, a health monitoring output component 635, a mode register component 640, a configuration reception component 645, a configuration reception component 650, a command reception component 655, or any combination thereof. Each of these components may communicate, directly or indirectly, with one another (e.g., via one or more buses).

The test mode identification component 625 may be configured as or otherwise support a means for identifying an initial power on of the memory device 620. The health monitoring configuration component 630 may be configured as or otherwise support a means for enabling, based at least in part on the initial power on of the memory device 620, health monitoring logic of the memory device 620 in a configuration associated with outputting a value regardless of a degradation level of the memory device 620. The health monitoring output component 635 may be configured as or otherwise support a means for outputting, based at least in part on enabling the health monitoring logic in the configuration, an indication of a result of the health monitoring logic in the configuration.

In some examples, the health monitoring output component 635 may be configured as or otherwise support a means for outputting an indication of the value based at least in part on a successful operation of the health monitoring logic.

In some examples, the health monitoring output component 635 may be configured as or otherwise support a means for outputting an indication of a second value different than the value based at least in part on an unsuccessful operation of the health monitoring logic. In some examples, outputting the indication of the second value may indicate a fault of the health monitoring logic.

In some examples, the health monitoring output component 635 may be configured as or otherwise support a means for outputting an indication of whether a degradation level of the memory device 620 satisfies a threshold, and the value may be associated with an indication that the degradation level of the memory device 620 satisfies the threshold.

In some examples, the configuration may be associated with a master trip condition of the health monitoring logic for indicating a fault.

In some examples, the mode register component 640 may be configured as or otherwise support a means for writing the indication of the result to a mode register based at least in part on enabling the health monitoring logic in the configuration. In some examples, the mode register component 640 may be configured as or otherwise support a means for outputting the indication of the result of the health monitoring logic from the mode register.

In some examples, the configuration reception component 645 may be configured as or otherwise support a means for receiving, based at least in part on outputting the indication of the result, an indication of a degradation level. In some examples, the health monitoring configuration component 630 may be configured as or otherwise support a means for enabling, based at least in part on receiving the indication of the degradation level, the health monitoring logic of the memory device 620 in a configuration that corresponds to the degradation level.

In some examples, the test mode identification component 625 may be configured as or otherwise support a means for identifying a condition associated with a test mode of the memory device 620. In some examples, the health monitoring configuration component 630 may be configured as or otherwise support a means for enabling, based at least in part on the condition associated with the test mode, health monitoring logic of the memory device 620 in a configuration that corresponds to an output of the health monitoring logic. In some examples, the health monitoring output component 635 may be configured as or otherwise support a means for outputting, based at least in part on enabling the health monitoring logic in the configuration that corresponds to the output, an indication of a result of the health monitoring logic.

In some examples, the test mode identification component 625 may be configured as or otherwise support a means for identifying an initial power on of the memory device 620.

In some examples, the test mode identification component 625 may be configured as or otherwise support a means for identifying an initial power on of the memory device 620 while coupled with a host device.

In some examples, the test mode identification component 625 may be configured as or otherwise support a means for identifying a duration of operating the memory device 620.

In some examples, the configuration reception component 650 may be configured as or otherwise support a means for receiving an indication of the configuration that corresponds to the output, and identifying the condition associated with the test mode may be based at least in part on receiving the indication of the configuration.

In some examples, the command reception component 655 may be configured as or otherwise support a means for receiving a command to enable the health monitoring logic in the configuration that corresponds to the output, and identifying the condition associated with the test mode may be based at least in part on receiving the command.

In some examples, the health monitoring configuration component 630 may be configured as or otherwise support a means for enabling a first portion of the health monitoring logic that is different than a second portion of the health monitoring logic that is associated with a degradation level of the memory device 620.

In some examples, the health monitoring configuration component 630 may be configured as or otherwise support a means for enabling a portion of the health monitoring logic that supports outputting the output regardless of a degradation level of the memory device 620.

In some examples, the health monitoring output component 635 may be configured as or otherwise support a means for outputting a value equal to the output based at least in part on a successful operation of the health monitoring logic.

In some examples, the health monitoring output component 635 may be configured as or otherwise support a means for outputting a value different than the output based at least in part on an unsuccessful operation of the health monitoring logic. In some examples, outputting the value different than the output may indicate a fault of the health monitoring logic.

In some examples, the health monitoring output component 635 may be configured as or otherwise support a means for outputting an indication of whether a degradation level of the memory device satisfies a threshold, and the output may be associated with an indication that the degradation level of the memory device satisfies the threshold.

In some examples, the configuration that corresponds to the output is associated with a master trip condition of the health monitoring logic for indicating a fault.

In some examples, the mode register component 640 may be configured as or otherwise support a means for writing the indication of the result to a mode register based at least in part on enabling the health monitoring logic in the configuration that corresponds to the output. In some examples, the mode register component 640 may be configured as or otherwise support a means for outputting the indication of the result of the health monitoring logic from the mode register.

In some examples, the configuration reception component 650 may be configured as or otherwise support a means for receiving, based at least in part on outputting the indication of the result, an indication of a degradation level. In some examples, the health monitoring configuration component 630 may be configured as or otherwise support a means for enabling, based at least in part on receiving the indication of the degradation level, the health monitoring logic of the memory device in a configuration that corresponds to the degradation level.

Figure 7:
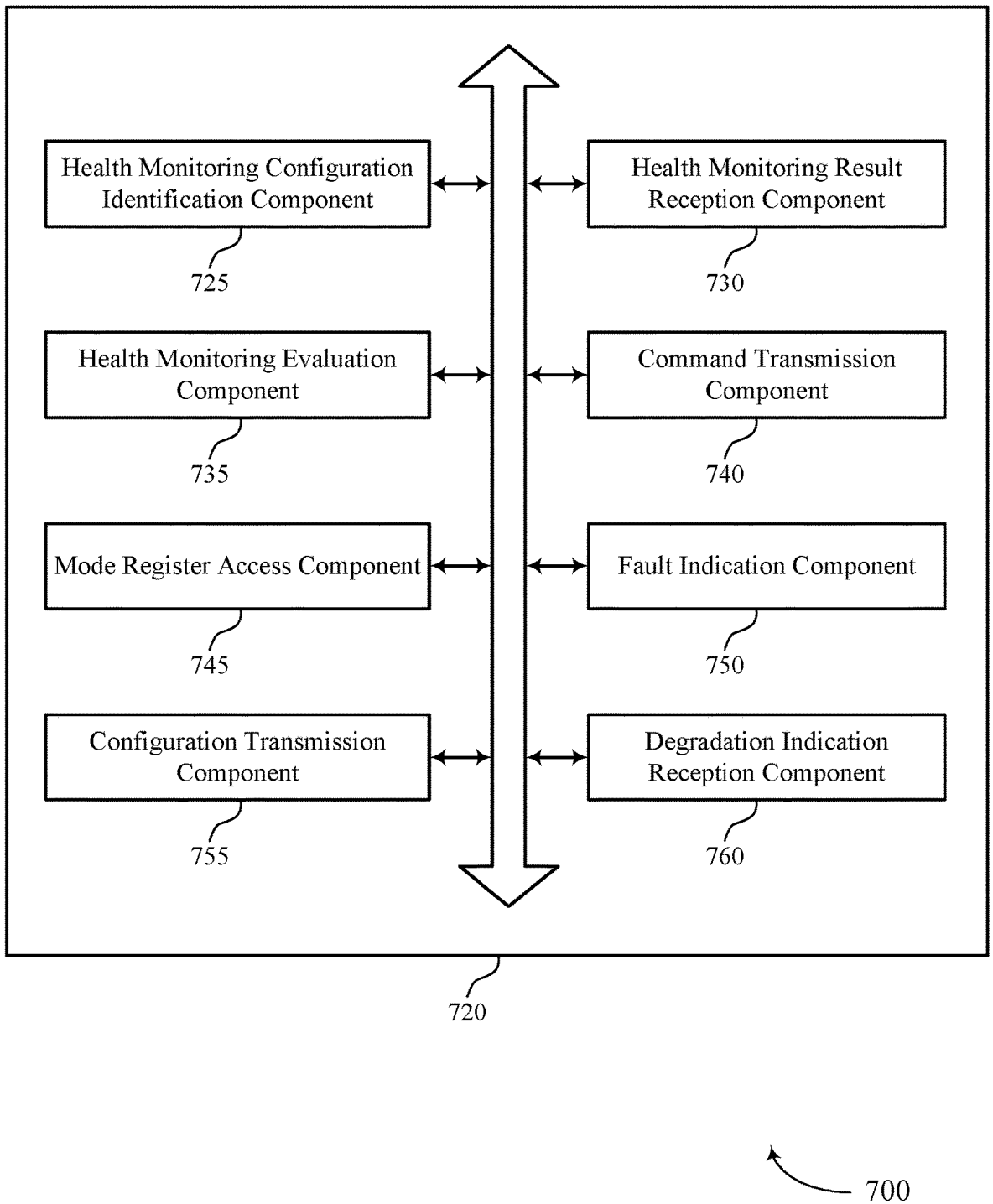
FIG. 7 shows a block diagram of a host device that supports evaluation of memory device health monitoring logic in accordance with examples as disclosed herein.

FIG. 7 shows a block diagram 700 of a host device 720 that supports evaluation of memory device health monitoring logic in accordance with examples as disclosed herein. The host device 720 may be an example of aspects of a host device as described with reference to FIGS. 1 through 5. The host device 720, or various components thereof, may be an example of means for performing various aspects of evaluation of memory device health monitoring logic as described herein. For example, the host device 720 may include a health monitoring configuration identification component 725, a health monitoring result reception component 730, a health monitoring evaluation component 735, a command transmission component 740, a mode register access component 745, a fault indication component 750, a configuration transmission component 755, a degradation indication reception component 760, or any combination thereof. Each of these components may communicate, directly or indirectly, with one another (e.g., via one or more buses).

The health monitoring configuration identification component 725 may be configured as or otherwise support a means for identifying that health monitoring logic of a memory device is operating in a configuration that corresponds to an output of the health monitoring logic. The health monitoring result reception component 730 may be configured as or otherwise support a means for receiving an indication of a result of the health monitoring logic that is operating in the configuration. The health monitoring evaluation component 735 may be configured as or otherwise support a means for evaluating a condition of the memory device based at least in part on comparing the indicated result of the health monitoring logic to the output of the health monitoring logic.

In some examples, the health monitoring configuration identification component 725 may be configured as or otherwise support a means for receiving an indication of the configuration that corresponds to the output, and identifying that the health monitoring logic is operating in the configuration may be based at least in part on receiving the indication of the configuration.

In some examples, the mode register access component 745 may be configured as or otherwise support a means for transmitting a command to read a mode register of the memory device, and receiving the indication of the configuration may be based at least in part on transmitting the command to read the mode register.

In some examples, the command transmission component 740 may be configured as or otherwise support a means for transmitting a command to enable the health monitoring logic in the configuration that corresponds to the output, and identifying that the health monitoring logic is operating in the configuration may be based at least in part on transmitting the command to enable the health monitoring logic in the configuration.

In some examples, the mode register access component 745 may be configured as or otherwise support a means for transmitting a command to write a mode register of the memory device, and transmitting the command to enable the health monitoring logic in the configuration may be based at least in part on transmitting the command to write the mode register.

In some examples, the configuration that corresponds to the output may be associated with a master trip condition of the health monitoring logic for indicating a fault.

In some examples, the health monitoring result reception component 730 may be configured as or otherwise support a means for receiving an indication of whether a degradation level of the memory device satisfies a threshold, and the output may be associated with an indication that the degradation level of the memory device satisfies the threshold.

In some examples, the health monitoring evaluation component 735 may be configured as or otherwise support a means for determining a fault of the memory device based at least in part on the indicated output of the health monitoring logic being different than the output of the health monitoring logic.

In some examples, the fault indication component 750 may be configured as or otherwise support a means for transmitting an indication that the host device 720 has determined the fault of the memory device.

In some examples, the health monitoring evaluation component 735 may be configured as or otherwise support a means for determining an expected operation of the health monitoring logic of the memory device based at least in part on the indicated result of the health monitoring logic being equal to the output.

In some examples, the configuration transmission component 755 may be configured as or otherwise support a means for transmitting, based at least in part on determining the expected operation, an indication of a degradation level for evaluating the memory device using the health monitoring logic. In some examples, the degradation indication reception component 760 may be configured as or otherwise support a means for receiving, based at least in part on transmitting the indication of the degradation level, an indication of whether the memory device satisfies the indicated degradation level.

Figure 8:
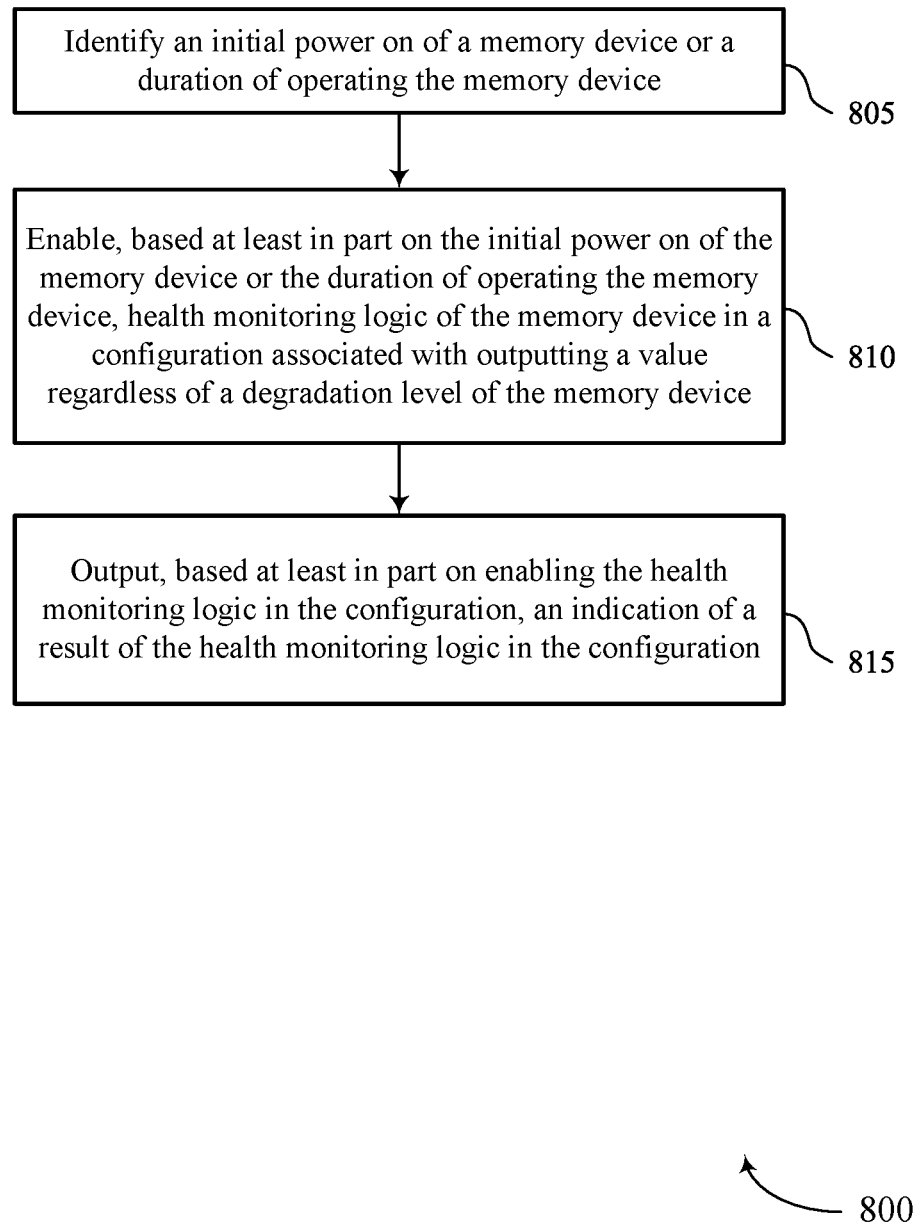
FIGS. 8 through 10 show flowcharts illustrating a method or methods that support evaluation of memory device health monitoring logic in accordance with examples as disclosed herein.

FIG. 8 shows a flowchart illustrating a method 800 that supports evaluation of memory device health monitoring logic in accordance with examples as disclosed herein. The operations of method 800 may be implemented by a memory device or its components as described herein. For example, the operations of method 800 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 805, the method may include identifying (e.g., at a memory device) an initial power on of a memory device or a duration of operating the memory device. The operations of 805 may be performed in accordance with examples as disclosed with reference to FIGS. 3 through 5. In some examples, aspects of the operations of 805 may be performed by a test mode identification component 625 as described with reference to FIG. 6.

At 810, the method may include enabling, based at least in part on the initial power on of the memory device or the duration of operating the memory device, health monitoring logic of the memory device in a configuration associated with outputting a value regardless of a degradation level of the memory device. The operations of 810 may be performed in accordance with examples as disclosed with reference to FIGS. 3 through 5. In some examples, aspects of the operations of 810 may be performed by a health monitoring configuration component 630 as described with reference to FIG. 6.

At 815, the method may include outputting, based at least in part on enabling the health monitoring logic in the configuration, an indication of a result of the health monitoring logic in the configuration. The operations of 815 may be performed in accordance with examples as disclosed with reference to FIGS. 3 through 5. In some examples, aspects of the operations of 815 may be performed by a health monitoring output component 635 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for identifying (e.g., at a memory device) an initial power on of a memory device or a duration of operating the memory device; enabling, based at least in part on the initial power on of the memory device, health monitoring logic of the memory device in a configuration associated with outputting a value regardless of a degradation level of the memory device; and outputting, based at least in part on enabling the health monitoring logic in the configuration, an indication of a result of the health monitoring logic in the configuration.

Aspect 2: The method, apparatus, or non-transitory computer-readable medium of aspect 1, further including operations, features, circuitry, logic, means, or instructions, or any combination thereof for outputting an indication of the value based at least in part on a successful operation of the health monitoring logic.

Aspect 3: The method, apparatus, or non-transitory computer-readable medium of any of aspects 1 through 2, further including operations, features, circuitry, logic, means, or instructions, or any combination thereof for outputting an indication of a second value different than the value based at least in part on an unsuccessful operation of the health monitoring logic.

Aspect 4: The method, apparatus, or non-transitory computer-readable medium of aspect 3 where outputting the indication of the second value indicates a fault of the health monitoring logic.

Aspect 5: The method, apparatus, or non-transitory computer-readable medium of any of aspects 1 through 4, further including operations, features, circuitry, logic, means, or instructions, or any combination thereof for outputting an indication of whether a degradation level of the memory device satisfies a threshold, where the value is associated with an indication that the degradation level of the memory device satisfies the threshold.

Aspect 6: The method, apparatus, or non-transitory computer-readable medium of any of aspects 1 through 5 where the configuration is associated with a master trip condition of the health monitoring logic for indicating a fault.

Aspect 7: The method, apparatus, or non-transitory computer-readable medium of any of aspects 1 through 6, further including operations, features, circuitry, logic, means, or instructions, or any combination thereof for writing the indication of the result to a mode register based at least in part on enabling the health monitoring logic in the configuration and outputting the indication of the result of the health monitoring logic from the mode register.

Aspect 8: The method, apparatus, or non-transitory computer-readable medium of any of aspects 1 through 7, further including operations, features, circuitry, logic, means, or instructions, or any combination thereof for receiving, based at least in part on outputting the indication of the result, an indication of a degradation level and enabling, based at least in part on receiving the indication of the degradation level, the health monitoring logic of the memory device in a configuration that corresponds to the degradation level.

Figure 9:
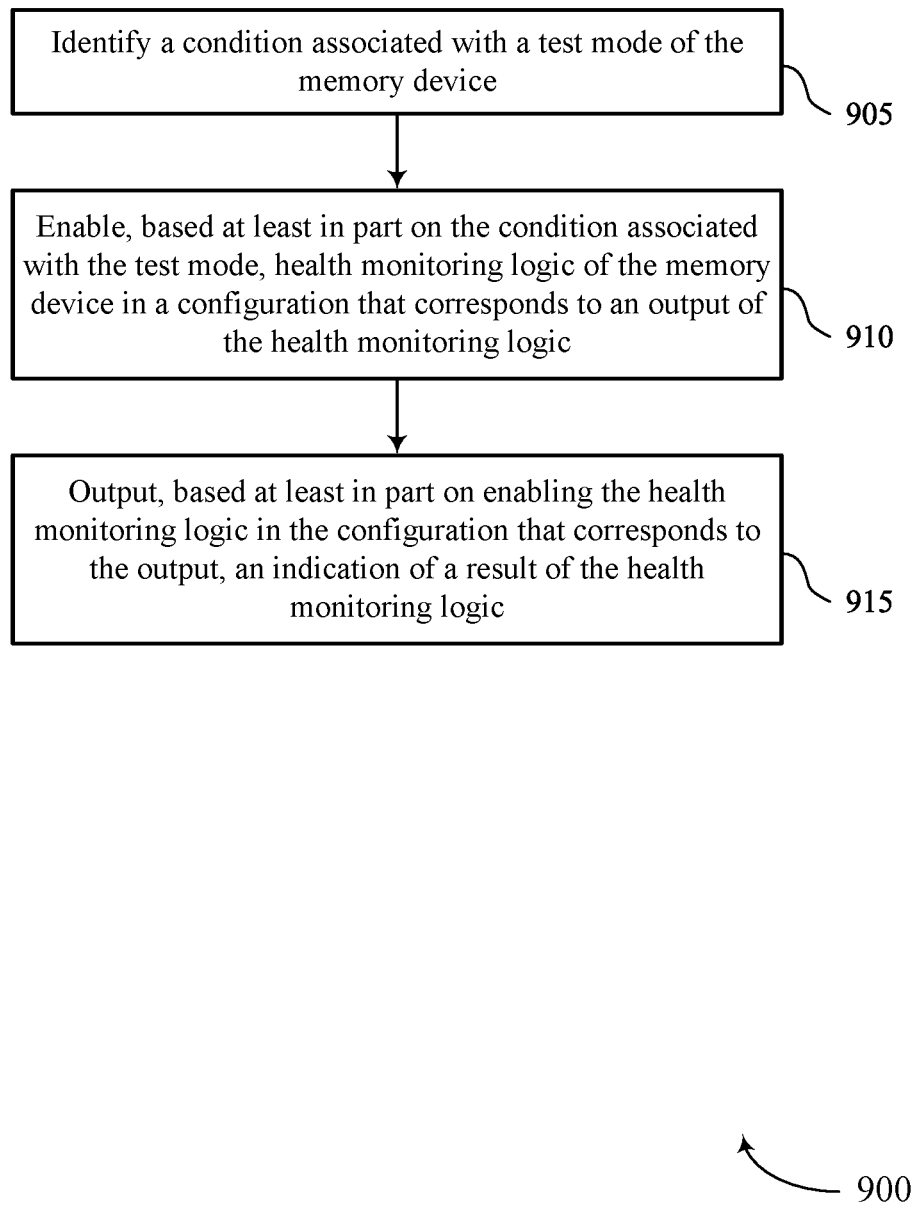

FIG. 9 shows a flowchart illustrating a method 900 that supports evaluation of memory device health monitoring logic in accordance with examples as disclosed herein. The operations of method 900 may be implemented by a memory device or its components as described herein. For example, the operations of method 900 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 905, the method may include identifying (e.g., at a memory device) a condition associated with a test mode of the memory device. The operations of 905 may be performed in accordance with examples as disclosed with reference to FIGS. 3 through 5. In some examples, aspects of the operations of 905 may be performed by a test mode identification component 625 as described with reference to FIG. 6.

At 910, the method may include enabling, based at least in part on the condition associated with the test mode, health monitoring logic of the memory device in a configuration that corresponds to an output of the health monitoring logic. The operations of 910 may be performed in accordance with examples as disclosed with reference to FIGS. 3 through 5. In some examples, aspects of the operations of 910 may be performed by a health monitoring configuration component 630 as described with reference to FIG. 6.

At 915, the method may include outputting, based at least in part on enabling the health monitoring logic in the configuration that corresponds to the output, an indication of a result of the health monitoring logic. The operations of 915 may be performed in accordance with examples as disclosed with reference to FIGS. 3 through 5. In some examples, aspects of the operations of 915 may be performed by a health monitoring output component 635 as described with reference to FIG. 6.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 9: A method, apparatus, or non-transitory computer-readable medium including operations, features, circuitry, logic, means, or instructions, or any combination thereof for identifying, at a memory device, a condition associated with a test mode of the memory device; enabling, based at least in part on the condition associated with the test mode, health monitoring logic of the memory device in a configuration that corresponds to an output of the health monitoring logic; and outputting, based at least in part on enabling the health monitoring logic in the configuration that corresponds to the output, an indication of a result of the health monitoring logic.

Aspect 10: The method, apparatus, or non-transitory computer-readable medium of aspect 9 including operations, features, circuitry, logic, means, or instructions, or any combination thereof for identifying an initial power on of the memory device.

Aspect 11: The method, apparatus, or non-transitory computer-readable medium of any of aspects 9 through 10, further including operations, features, circuitry, logic, means, or instructions, or any combination thereof for identifying an initial power on of the memory device while coupled with a host device.

Aspect 12: The method, apparatus, or non-transitory computer-readable medium of any of aspects 9 through 11, further including operations, features, circuitry, logic, means, or instructions, or any combination thereof for identifying a duration of operating the memory device.

Aspect 13: The method, apparatus, or non-transitory computer-readable medium of any of aspects 9 through 12, further including operations, features, circuitry, logic, means, or instructions, or any combination thereof for receiving an indication of the configuration that corresponds to the output, where identifying the condition associated with the test mode is based at least in part on receiving the indication of the configuration.

Aspect 14: The method, apparatus, or non-transitory computer-readable medium of any of aspects 9 through 13, further including operations, features, circuitry, logic, means, or instructions, or any combination thereof for receiving a command to enable the health monitoring logic in the configuration that corresponds to the output, where identifying the condition associated with the test mode is based at least in part on receiving the command.

Aspect 15: The method, apparatus, or non-transitory computer-readable medium of any of aspects 9 through 14, further including operations, features, circuitry, logic, means, or instructions, or any combination thereof for enabling a first portion of the health monitoring logic that is different than a second portion of the health monitoring logic that is associated with a degradation level of the memory device.

Aspect 16: The method, apparatus, or non-transitory computer-readable medium of any of aspects 9 through 15, further including operations, features, circuitry, logic, means, or instructions, or any combination thereof for enabling a portion of the health monitoring logic that supports outputting the output regardless of a degradation level of the memory device.

Aspect 17: The method, apparatus, or non-transitory computer-readable medium of any of aspects 9 through 16, further including operations, features, circuitry, logic, means, or instructions, or any combination thereof for outputting a value equal to the output based at least in part on a successful operation of the health monitoring logic.

Aspect 18: The method, apparatus, or non-transitory computer-readable medium of any of aspects 9 through 17, further including operations, features, circuitry, logic, means, or instructions, or any combination thereof for outputting a value different than the output based at least in part on an unsuccessful operation of the health monitoring logic.

Aspect 19: The method, apparatus, or non-transitory computer-readable medium of aspect 18 where outputting the value different than the output indicates a fault of the health monitoring logic.

Aspect 20: The method, apparatus, or non-transitory computer-readable medium of any of aspects 9 through 19, further including operations, features, circuitry, logic, means, or instructions, or any combination thereof for outputting an indication of whether a degradation level of the memory device satisfies a threshold, where the output is associated with an indication that the degradation level of the memory device satisfies the threshold.

Aspect 21: The method, apparatus, or non-transitory computer-readable medium of any of aspects 9 through 20 where the configuration that corresponds to the output is associated with a master trip condition of the health monitoring logic for indicating a fault.

Aspect 22: The method, apparatus, or non-transitory computer-readable medium of any of aspects 9 through 21, further including operations, features, circuitry, logic, means, or instructions, or any combination thereof for writing the indication of the result to a mode register based at least in part on enabling the health monitoring logic in the configuration that corresponds to the output and outputting the indication of the result of the health monitoring logic from the mode register.

Aspect 23: The method, apparatus, or non-transitory computer-readable medium of any of aspects 9 through 22, further including operations, features, circuitry, logic, means, or instructions, or any combination thereof for receiving, based at least in part on outputting the indication of the result, an indication of a degradation level and enabling, based at least in part on receiving the indication of the degradation level, the health monitoring logic of the memory device in a configuration that corresponds to the degradation level.

Figure 10:
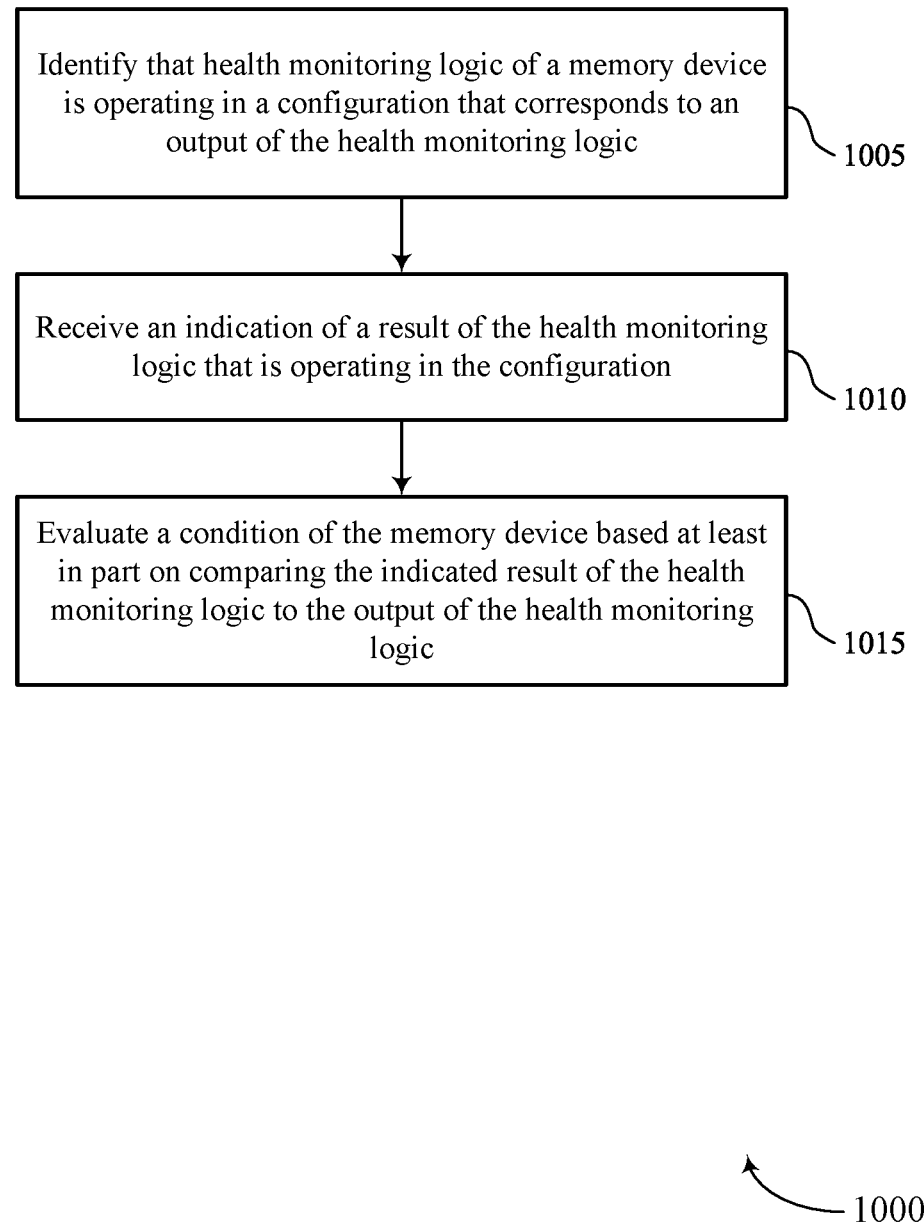

FIG. 10 shows a flowchart illustrating a method 1000 that supports evaluation of memory device health monitoring logic in accordance with examples as disclosed herein. The operations of method 1000 may be implemented by a host device or its components as described herein. For example, the operations of method 1000 may be performed by a host device as described with reference to FIGS. 1 through 5 and 7. In some examples, a host device may execute a set of instructions to control the functional elements of the device to perform the described functions. Additionally, or alternatively, the host device may perform aspects of the described functions using special-purpose hardware.

At 1005, the method may include identifying (e.g., at a host device) that health monitoring logic of a memory device is operating in a configuration that corresponds to an output of the health monitoring logic. The operations of 1005 may be performed in accordance with examples as disclosed with reference to FIGS. 3 through 5. In some examples, aspects of the operations of 1005 may be performed by a health monitoring configuration identification component 725 as described with reference to FIG. 7.

At 1010, the method may include receiving (e.g., at the host device) an indication of a result of the health monitoring logic that is operating in the configuration. The operations of 1010 may be performed in accordance with examples as disclosed with reference to FIGS. 3 through 5. In some examples, aspects of the operations of 1010 may be performed by a health monitoring result reception component 730 as described with reference to FIG. 7.

At 1015, the method may include evaluating a condition of the memory device based at least in part on comparing the indicated result of the health monitoring logic to the output of the health monitoring logic. The operations of 1015 may be performed in accordance with examples as disclosed with reference to FIGS. 3 through 5. In some examples, aspects of the operations of 1015 may be performed by a health monitoring evaluation component 735 as described with reference to FIG. 7.

In some examples, an apparatus as described herein may perform a method or methods, such as the method 1000. The apparatus may include features, circuitry, logic, means, or instructions (e.g., a non-transitory computer-readable medium storing instructions executable by a processor), or any combination thereof for performing the following aspects of the present disclosure:

Aspect 24: A method, apparatus, or non-transitory computer-readable medium including operations, features, circuitry, logic, means, or instructions, or any combination thereof for identifying (e.g., at a host device) that health monitoring logic of a memory device is operating in a configuration that corresponds to an output of the health monitoring logic; receiving (e.g., at the host device) an indication of a result of the health monitoring logic that is operating in the configuration; and evaluating a condition of the memory device based at least in part on comparing the indicated result of the health monitoring logic to the output of the health monitoring logic.

Aspect 25: The method, apparatus, or non-transitory computer-readable medium of aspect 24, further including operations, features, circuitry, logic, means, or instructions, or any combination thereof for receiving an indication of the configuration that corresponds to the output, where identifying that the health monitoring logic is operating in the configuration is based at least in part on receiving the indication of the configuration.

Aspect 26: The method, apparatus, or non-transitory computer-readable medium of aspect 25, further including operations, features, circuitry, logic, means, or instructions, or any combination thereof for transmitting a command to read a mode register of the memory device, where receiving the indication of the configuration is based at least in part on transmitting the command to read the mode register.

Aspect 27: The method, apparatus, or non-transitory computer-readable medium of any of aspects 24 through 26, further including operations, features, circuitry, logic, means, or instructions, or any combination thereof for transmitting a command to enable the health monitoring logic in the configuration that corresponds to the output, where identifying that the health monitoring logic is operating in the configuration is based at least in part on transmitting the command to enable the health monitoring logic in the configuration.

Aspect 28: The method, apparatus, or non-transitory computer-readable medium of aspect 27, further including operations, features, circuitry, logic, means, or instructions, or any combination thereof for transmitting a command to write a mode register of the memory device, where transmitting the command to enable the health monitoring logic in the configuration is based at least in part on transmitting the command to write the mode register.

Aspect 29: The method, apparatus, or non-transitory computer-readable medium of any of aspects 24 through 28 where the configuration that corresponds to the output is associated with a master trip condition of the health monitoring logic for indicating a fault.

Aspect 30: The method, apparatus, or non-transitory computer-readable medium of any of aspects 24 through 29, further including operations, features, circuitry, logic, means, or instructions, or any combination thereof for receiving an indication of whether a degradation level of the memory device satisfies a threshold, where the output is associated with an indication that the degradation level of the memory device satisfies the threshold.

Aspect 31: The method, apparatus, or non-transitory computer-readable medium of any of aspects 24 through 30, further including operations, features, circuitry, logic, means, or instructions, or any combination thereof for determining a fault of the memory device based at least in part on the indicated output of the health monitoring logic being different than the output of the health monitoring logic.

Aspect 32: The method, apparatus, or non-transitory computer-readable medium of aspect 31, further including operations, features, circuitry, logic, means, or instructions, or any combination thereof for transmitting an indication that the fault of the memory device has been determined (e.g., by the host device).

Aspect 33: The method, apparatus, or non-transitory computer-readable medium of any of aspects 24 through 32, further including operations, features, circuitry, logic, means, or instructions, or any combination thereof for determining an expected operation of the health monitoring logic of the memory device based at least in part on the indicated result of the health monitoring logic being equal to the output.

Aspect 34: The method, apparatus, or non-transitory computer-readable medium of aspect 33, further including operations, features, circuitry, logic, means, or instructions, or any combination thereof for transmitting, based at least in part on determining the expected operation, an indication of a degradation level for evaluating the memory device using the health monitoring logic and receiving, based at least in part on transmitting the indication of the degradation level, an indication of whether the memory device satisfies the indicated degradation level.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 35: An apparatus, including: a memory array; and logic coupled with the memory array and configured to cause the apparatus to: identify a condition associated with a test mode; enable, based at least in part on the condition associated with the test mode, health monitoring logic of the apparatus in a configuration that corresponds to an output of the health monitoring logic; and output, based at least in part on enabling the health monitoring logic in the configuration that corresponds to the output, an indication of a result of the health monitoring logic.

Aspect 36: The apparatus of aspect 35, where the logic is configured to cause the apparatus to: identify an initial power on of the apparatus.

Aspect 37: The apparatus of any of aspects 35 through 36, where the logic is configured to cause the apparatus to: identify an initial power on of the apparatus while coupled with a host device.

Aspect 38: The apparatus of any of aspects 35 through 36, where the logic is configured to cause the apparatus to: identify a duration of operating the apparatus.

Aspect 39: The apparatus of any of aspects 35 through 37, where the logic is configured to cause the apparatus to: receive an indication of the configuration that corresponds to the output, where identifying the condition associated with the test mode is based at least in part on receiving the indication of the configuration.

Aspect 40: The apparatus of any of aspects 35 through 39, where the logic is configured to cause the apparatus to: receive a command to enable the health monitoring logic in the configuration that corresponds to the output, where identifying the condition associated with the test mode is based at least in part on receiving the command.

Aspect 41: The apparatus of any of aspects 35 through 40, where the logic is configured to cause the apparatus to: enable a first portion of the health monitoring logic that is different than a second portion of the health monitoring logic that is associated with a degradation level of the apparatus.

Aspect 42: The apparatus of any of aspects 35 through 41, where the logic is configured to cause the apparatus to: enable a portion of the health monitoring logic that supports outputting the output regardless of a degradation level of the apparatus.

Aspect 43: The apparatus of any of aspects 35 through 42, where the logic is configured to cause the apparatus to: output a value equal to the output based at least in part on a successful operation of the health monitoring logic.

Aspect 44: The apparatus of any of aspects 35 through 43, where the logic is configured to cause the apparatus to: output a value different than the output based at least in part on an unsuccessful operation of the health monitoring logic.

Aspect 45: The apparatus of aspect 44, where outputting the value different than the output indicates a fault of the health monitoring logic.

Aspect 46: The apparatus of any of aspects 35 through 45, where the logic is configured to cause the apparatus to: output an indication of whether a degradation level of the apparatus satisfies a threshold, where the output is associated with an indication that the degradation level of the apparatus satisfies the threshold.

Aspect 47: The apparatus of any of aspects 35 through 46, where the configuration that corresponds to the output is associated with a master trip condition of the health monitoring logic for indicating a fault.

Aspect 48: The apparatus of any of aspects 35 through 47, where the logic is configured to cause the apparatus to: write the indication of the result to a mode register of the apparatus based at least in part on enabling the health monitoring logic in the configuration that corresponds to the output; and output the indication of the result of the health monitoring logic from the mode register.

Aspect 49: The apparatus of any of aspects 35 through 48, where the logic is configured to cause the apparatus to: receive, based at least in part on outputting the result, an indication of a degradation level; and enable, based at least in part on receiving the indication of the degradation level, the health monitoring logic in a configuration that corresponds to the degradation level.

An apparatus is described. The following provides an overview of aspects of the apparatus as described herein:

Aspect 50: An apparatus, including: logic operable to couple with a memory device, the logic configured to cause the apparatus to: identify that health monitoring logic of the memory device is operating in a configuration that corresponds to an output of the health monitoring logic; receive an indication of a result of the health monitoring logic that is operating in the configuration; and evaluate a condition of the memory device based at least in part on comparing the indicated result of the health monitoring logic to the output of the health monitoring logic.

Aspect 51: The apparatus of aspect 50, where the logic is configured to cause the apparatus to: receive an indication of the configuration that corresponds to the output, where identifying that the health monitoring logic is operating in the configuration is based at least in part on receiving the indication of the configuration.

Aspect 52: The apparatus of any of aspects 50 through 51, where the logic is configured to cause the apparatus to: transmit a command to read a mode register of the memory device, where receiving the indication of the configuration is based at least in part on transmitting the command to read the mode register.

Aspect 53: The apparatus of any of aspects 50 through 52, where the logic is configured to cause the apparatus to: transmit a command to enable the health monitoring logic in the configuration that corresponds to the output, where identifying that the health monitoring logic is operating in the configuration is based at least in part on transmitting the command to enable the health monitoring logic in the configuration.

Aspect 54: The apparatus of any of aspects 50 through 53, where the logic is configured to cause the apparatus to: transmit a command to write a mode register of the memory device, where transmitting the command to enable the health monitoring logic in the configuration is based at least in part on transmitting the command to write the mode register.

Aspect 55: The apparatus of any of aspects 50 through 54, where the configuration that corresponds to the output is associated with a master trip condition of the health monitoring logic for indicating a fault.

Aspect 56: The apparatus of any of aspects 50 through 55, where the logic is configured to cause the apparatus to: receive an indication of whether a degradation level of the memory device satisfies a threshold, where the output is associated with an indication that the degradation level of the memory device satisfies the threshold.

Aspect 57: The apparatus of any of aspects 50 through 56, where the logic is configured to cause the apparatus to: determine a fault of the memory device based at least in part on the indicated output of the health monitoring logic being different than the output of the health monitoring logic.

Aspect 58: The apparatus of any of aspects 50 through 57, where the logic is configured to cause the apparatus to: transmit an indication that the apparatus has determined the fault of the memory device.

Aspect 59: The apparatus of any of aspects 50 through 58, where the logic is configured to cause the apparatus to: determine an expected operation of the health monitoring logic of the memory device based at least in part on the indicated result of the health monitoring logic being equal to the output.

Aspect 60: The apparatus of aspect 59, where the logic configured to cause the apparatus to: transmit, based at least in part on determining the expected operation, an indication of a degradation level for evaluating the memory device using the health monitoring logic; and receive, based at least in part on transmitting the indication of the degradation level, an indication of whether the memory device satisfies the indicated degradation level.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for evaluating health monitoring logic of a memory device, comprising:
identifying, at the memory device, a condition associated with a test mode of the memory device;
enabling, based on the identifying the condition associated with the test mode, the health monitoring logic of the memory device in a test mode configuration that corresponds to an expected output of the health monitoring logic; and
outputting, based on the enabling the health monitoring logic in the test mode configuration that corresponds to the expected output, an indication of a result of the health monitoring logic.

2. The method of claim 1, further comprising:
receiving an indication of the test mode configuration that corresponds to the expected output,
wherein the identifying the condition associated with the test mode is based on receiving the indication of the test mode configuration.

3. The method of claim 1, further comprising:
receiving a command to enable the health monitoring logic in the test mode configuration that corresponds to the expected output, wherein the identifying the condition associated with the test mode is based on receiving the command.

4. The method of claim 1, further comprising:
enabling a first portion of the health monitoring logic that is different than a second portion of the health monitoring logic that is associated with a degradation level of the memory device.

5. The method of claim 1, further comprising:
enabling a portion of the health monitoring logic that supports outputting the expected output regardless of a degradation level of the memory device.

6. The method of claim 1, further comprising:
outputting a value equal to the expected output based on a successful operation of the health monitoring logic; or
outputting a value different than the expected output based on an unsuccessful operation of the health monitoring logic.

7. A memory device, comprising:
a memory array; and
logic coupled with the memory array and configured to cause the memory device to:
identify a condition associated with a test mode of the memory device;
enable, based on the identification of the condition associated with the test mode, health monitoring logic of the memory device in a test mode configuration that corresponds to an expected output of the health monitoring logic; and
output, based on the enabling of the health monitoring logic in the test mode configuration that corresponds to the expected output, an indication of a result of the health monitoring logic.

8. The memory device of claim 7, wherein the logic is configured to cause the memory device to:
identify an initial power on of the memory device, wherein the identification of the condition associated with the test mode is based on the identification of the initial power on of the memory device.

9. The memory device of claim 7, wherein the logic is configured to cause the memory device to:
identify an initial power on of the memory device while coupled with a host device, wherein the identification of the condition associated with the test mode is based on the identification of the initial power on of the memory device while coupled with the host device.

10. The memory device of claim 7, wherein the logic is configured to cause the memory device to:
identify a duration of operating the memory device, wherein the identification of the condition associated with the test mode is based on the identification of the duration of operating the memory device.

11. The memory device of claim 7, wherein the logic is configured to cause the memory device to:
receive an indication of the test mode configuration that corresponds to the expected output, wherein the identification of the condition associated with the test mode is based on the reception of the indication of the test mode configuration.

12. The memory device of claim 7, wherein the logic is configured to cause the memory device to:
receive a command to enable the health monitoring logic in the test mode configuration that corresponds to the expected output, wherein the identification of the condition associated with the test mode is based on the reception of the command.

13. The memory device of claim 7, wherein the logic is configured to cause the memory device to:
enable a first portion of the health monitoring logic that is different than a second portion of the health monitoring logic that is associated with a degradation level of the memory device.

14. The memory device of claim 7, wherein the logic is configured to cause the memory device to:
enable a portion of the health monitoring logic that supports outputting the expected output regardless of a degradation level of the memory device.

15. The memory device of claim 7, wherein the logic is configured to cause the memory device to:
output a value equal to the expected output based on a successful operation of the health monitoring logic; and
output a value different than the expected output based on an unsuccessful operation of the health monitoring logic.

16. The memory device of claim 15, wherein outputting the value different than the expected output indicates a fault of the health monitoring logic.

17. The memory device of claim 7, wherein the logic is configured to cause the memory device to:
output an indication of whether a degradation level of the memory device satisfies a threshold, wherein the outputting is associated with an indication that the degradation level of the memory device satisfies the threshold.

18. The memory device of claim 7, wherein the test mode configuration that corresponds to the expected output is associated with a master trip condition of the health monitoring logic for indicating a fault.

19. The memory device of claim 7, wherein the logic is configured to cause the memory device to:
write the indication of the result to a mode register of the memory device based on the enabling of the health monitoring logic in the test mode configuration that corresponds to the expected output; and output the indication of the result of the health monitoring logic from the mode register.

20. The memory device of claim 7, wherein the logic is configured to cause the memory device to:

receive, based on the output of the result, an indication of a degradation level; and enable, based on the reception of the indication of the degradation level, the health monitoring logic in a second test mode configuration that corresponds to the degradation level.

\* \* \* \* \*